United States Patent [19]

Miura et al.

[11] Patent Number: 5,480,832
[45] Date of Patent: Jan. 2, 1996

[54] METHOD FOR FABRICATION OF SEMICONDUCTOR DEVICE

[75] Inventors: Shoji Miura, Anjo; Takayuki Sugisaka, Kariya; Atsushi Komura, Obu; Toshio Sakakibara, Nishio, all of Japan

[73] Assignee: Nippondenso Co., Ltd., Kariya, Japan

[21] Appl. No.: 75,514

[22] PCT Filed: Oct. 12, 1992

[86] PCT No.: PCT/JP92/01326

§ 371 Date: Oct. 21, 1993

§ 102(e) Date: Oct. 21, 1993

[87] PCT Pub. No.: WO93/08596

PCT Pub. Date: Apr. 29, 1993

[30] Foreign Application Priority Data

Oct. 14, 1991 [JP] Japan ..................... 3-265046
Oct. 14, 1991 [JP] Japan ..................... 3-265047
Oct. 14, 1991 [JP] Japan ..................... 3-265057

[51] Int. Cl.$^6$ ................................. H01L 21/76
[52] U.S. Cl. ............... 437/67; 437/62; 437/974; 148/DIG. 50; 148/DIG. 135
[58] Field of Search ............... 437/67, 61, 62, 437/974; 148/DIG. 50, DIG. 135

[56] References Cited

U.S. PATENT DOCUMENTS

| | | | |
|---|---|---|---|
| 3,966,577 | 6/1976 | Hochberg | 437/62 |
| 4,307,180 | 12/1981 | Pogee | 437/67 |
| 4,389,294 | 7/1983 | Anantha et al. | 437/67 |
| 4,571,819 | 2/1986 | Rogers et al. | 148/DIG. 50 |
| 4,671,851 | 6/1987 | Beyer et al. | 156/645 |
| 4,740,480 | 4/1988 | Ooka | 437/61 |
| 4,897,154 | 1/1990 | Chakravarti et al. | 156/643 |
| 4,952,524 | 8/1990 | Lee et al. | 437/67 |
| 5,072,287 | 12/1991 | Nakagawa et al. | 148/DIG. 12 |

FOREIGN PATENT DOCUMENTS

| | | |
|---|---|---|
| 224646 | 6/1987 | European Pat. Off. . |
| 388597 | 9/1990 | European Pat. Off. . |
| 398468 | 11/1990 | European Pat. Off. . |

(List continued on next page.)

OTHER PUBLICATIONS

S. J. Fonashi, "Damage Effects in Dry Etching", Solid State Technology, Apr. 1985, pp. 201–205.

(List continued on next page.)

Primary Examiner—Brian E. Hearn
Assistant Examiner—Trung Dang
Attorney, Agent, or Firm—Cushman, Darby & Cushman

[57] ABSTRACT

An object of the invention is to prevent the occurrence of breaking or short-circuiting of a wiring caused by a difference in level in an isolation trench area formed in an SOI substrate. An oxide film is formed for a pad on the main surface of an SOI layer formed on an insulating substrate, a silicon nitride film are formed and an SiO$_2$ film in order, then an isolation trench reaching to the insulating substrate is by means of an R.I.E process using the SiO$_2$ film as a mask. Thereafter an insulating film is formed on an inside wall of the isolation trench by means of thermal oxidation, the isolation trench is filled with polysilicon, the polysilicon is etched back while controlling the etching so that the top of the polysilicon in the isolation trench remains higher than the top of the silicon nitride film, an extra part of the polysilicon deposited on the surface of the substrate, is removed and then the SiO$_2$ film used as a mask when forming the isolation trench is etched off using the polysilicon in the isolation trench and the silicon nitride film as an etching stopper. In this manner, since the SiO$_2$ film used as a mask is etched off after filling the isolation trench with polysilicon, the oxide film for isolating between the substrates is not etched when removing the mask film. Moreover since the polysilicon is the isolation trench and the silicon nitride film act as an etching stopper when etching off the SiO$_2$ film used as a mask, the oxide film for a pad existing thereunder and the insulating film formed on an inside wall of the trench can also be prevented from being etched and a flatness at an isolation trench area is not deteriorated.

26 Claims, 15 Drawing Sheets

FOREIGN PATENT DOCUMENTS

| | | |
|---|---|---|
| 437950 | 7/1991 | European Pat. Off. . |
| 59-208744 | 11/1984 | Japan . |
| 61-005544 | 1/1986 | Japan . |
| 61-059852 | 3/1986 | Japan . |
| 0214446 | 9/1986 | Japan ................................. 437/67 |
| 62-101034 | 5/1987 | Japan . |
| 62-214638 | 9/1987 | Japan . |
| 63-033829 | 2/1988 | Japan . |
| 63-033839 | 2/1988 | Japan . |
| 0086560 | 4/1988 | Japan ................................. 437/67 |
| 0265536 | 10/1989 | Japan ................................. 437/67 |
| 2-148855 | 6/1990 | Japan . |
| 0267963 | 11/1990 | Japan ................................. 437/67 |
| 3-127850 | 5/1991 | Japan . |
| 3-149849 | 6/1991 | Japan . |
| 3-149836 | 6/1991 | Japan . |
| 3-129854 | 6/1991 | Japan . |
| 3-155650 | 7/1991 | Japan . |
| 4-209551 | 7/1992 | Japan . |

OTHER PUBLICATIONS

Hashimoto et al, "Deep Trench Well Isolation For 256KB 6YT CMOS Static RAM", Semiconductor Device Engineering Lab. Kawasaki, Japan pp. 94–95, 1985.

Goto et al, "A New Isloation Technology For Bipolar VLSI Logic (IOP–L)", Bipolar Process Division of Fujitsu Limited, pp. 42–43.

L. Treitinger, "Ultra–Fast Silicon Bipolar Technology", Springer Series in Electronics and Photonics 27, pp. 66–71.

5,480,832

1

METHOD FOR FABRICATION OF SEMICONDUCTOR DEVICE

TECHNICAL FIELD

The present invention relates to a method for fabrication of a semiconductor device and particularly to a manufacturing method preferred for isolating elements from each other by forming a deep trench on a silicon substrate.

BACKGROUND ART

Up to now a method for isolating respective elements from each other by means of an insulator has been known as a element isolating method used in a monolithic semiconductor integrated circuit.

In the Japanese patent Application Laid Open No. 59852-1986, for example, a semiconductor device manufacturing method of isolating elements from each other by forming an isolation trench on a bonded SOI (silicon on insulator) substrate is disclosed. This method is the one which makes an SOI substrate by bonding a silicon substrate 42 with another silicon substrate 40 on which surface an insulating film 41 is formed as shown in FIG. 36(A) through an insulating film 41 as shown in FIG. 36(B), forms isolation trenches 43 reaching to the insulating film 41 in the SOI substrate from one main surface of this SOI substrate, then forms an insulating film 44 on the surface of the SOI substrate including inside walls of the isolation trench 43 by thermal oxidation or the like as shown in FIG. 36(C), fills the isolation trenches 43 with polysilicon 45 as shown in FIG. 36(D), removes extra parts of the insulating film 44 and polysilicon 45 which comes out from the isolation trenches 43, and electrically completely isolates respective element areas 46 from the substrate 40 or from each other by means of an insulator as shown FIG. 36(E).

As disclosed on page 66 of a reference paper "Ultra-Fast Silicon Bipolar Technology", for example, a method for forming an isolation trench for isolating respective elements from each other after forming a field oxide film which has a thick portion and a thin portion on the main surface of a silicon substrate is known as a method for forming an isolation trench. The method will be described in the following.

As shown in FIG. 37, the method forms one by one in order a partially trick field oxide film 32, a silicon nitride film 33 and a silicon oxide film to be used as a mask on the main surface of a silicon substrate 31, forms an opening by selectively etching the field oxide film 32, the silicon nitride film 33 and the silicon oxide film 34 in an area where the field oxide film is thin in thickness, then forms an isolation trench 35 by etching the silicon substrate 31 through the opening. And it etches off the silicon oxide film 34 used as a mask, forms an insulating film 36 on an inside wall of the isolation trench 35, then fills polysilicon 37 in the isolation trench 35. Further, it performs etching back of the polysilicon 37 deposited on the silicon nitride film 33 when filling the isolation trench with the polysilicon 37, etches off the silicon nitride film 33, and then forms a silicon oxide film 38 on the top of the polysilicon 37 in the isolation trench (see FIG. 38). In this manner, the method electrically divides completely the silicon substrate 31 into respective element areas by the isolation trench 35 and the insulating film 36.

In a series of manufacturing treatments shown in FIG. 36(A) to 36(E), up to now as described above, an oxide film is generally formed on the surface of an SOI substrate as a mask for forming an isolation trench on the SOI substrate. And the oxide film used as the mask for forming an isolation trench has been removed at once after forming the isolation

2 trench. However as shown in FIG. 36(E), in case of isolating an element area 46 by insulating film 41 from a substrate 40, an insulating film for isolating from the substrate is exposed inside the isolation trench immediately after forming the isolation trench. In this case, since the insulating film 41 inside the SOI substrate for isolating substrate and the oxide film for the mask have about equal etching rate, so that, if attempting to etch off the oxide film as the mask immediately after forming the isolation trench, the insulating film inside the substrate also is etched off at the same time.

The present invention has been made by taking consideration of the above-mentioned actual facts. The first object of the invention is to provide a method for manufacturing a semiconductor device which makes it possible to prevent a local deterioration of dielectric strength in an isolation trench area by protecting the insulating film for isolating between the substrates which is exposed inside the isolation trenches from being etched in the course of the treatment.

The reason why an isolation trench is formed in an area where a field oxide film is thin in thickness as shown in FIG. 37 is that deterioration of flatness of the surface of a substrate is prevented which is feared in case of forming the isolation trench in an area where the field oxide film is thick in thickness. In case of forming an isolation trench in an area where a field oxide film is thick, an end face of the field oxide film is largely exposed by the isolation trench, the field oxide film also is etched when etching off a silicon oxide film used as a mask, and a deep hollow is caused to deteriorate flatness of the substrate. Deterioration of flatness of the substrate causes such a problem as breaking and short-circuiting of a polysilicon wiring or aluminum wiring. Therefore, if an isolation trench is formed in an area where a field oxide film is thin in thickness, deterioration of flatness of the substrate does not cause much of a problem even if the field oxide film is etched.

On the other hand, in case of forming an isolation trench in an area where a field oxide film is thin after forming the field oxide film as in a former method shown in FIGS. 37 and 38, it is necessary to make a semiconductor device for example a transistor to be manufactured larger in size by allowing for some divergence in mask matching so as to surely prevent trouble due to exposing the end face of a thick part of the field oxide film by an isolation trench.

The second object of the invention is to prevent a semiconductor device from being made unnecessarily large in size without deteriorating flatness of the surface of a substrate even if forming an isolation trench in an area where a field oxide film is thick by taking consideration of the above-mentioned problems.

An isolation trench as described above is generally formed by etching a silicon substrate through the R.I.E (reactive ion etching) process. The R.I.E process is a process in which a cathode fall voltage (bias voltage) is generated by applying a high frequency voltage to an electrode on which a silicon substrate is mounted and the silicon substrate is etched by having ions or radicals as active particles generated by being plasma discharged material gas of a fluoride series collide and react against the substrate. Since the R.I.E process being accompanied by a physical etching action is greatly aggressive to the silicon substrate, it caues crystal defects on the surface of inside walls of an isolation trench and the surface of the silicon substrate surrounding the inside walls cause leakage of electric current due to the etching damage. For the purpose of eliminating such crystal defects, up to now an inside wall of an isolation trench has been processed by means of a sacrifice oxidation process or C,D,E (chemical dry etching) process, as disclosed in Japanese patent Applications Laid Open No. 127850-1991 and No. 129854-1991, for example. The sacrifice oxidation process is a process of eliminating crystal defects by etching off an oxide film after forming the oxide film reaching to a depth where crystal defects exist in inside walls of an isolation trench. And the C.D.E process is a process of etching off a part having crystal defects by only a less aggressive chemical etching by means of radicals of material gas activated by plasma discharge.

DISCLOSURE OF INVENTION

To attain the first object of the invention, a method of the invention fills in an isolation trench with polysilicon, removes an extra part of the polysilicon protruded out from the isolation trench on the substrate, and then etches off an oxide film as a mark.

Namely, a method of the invention deposits a layer for a mask on the main surface of a semiconductor substrate, makes an opening for exposing a specified part of the main surface of the semiconductor substrate in the layer for a mask, forms a groove by etching the semiconductor substrate through the opening by making the layer for a mask as a mask, forms an insulating film on the surface of inside walls of the groove, fills in the groove with a filler through the opening, removes an extra part of the filler deposited on the surface of the layer for a mask to expose the layer for a mask, and then removes the layer for a mask.

In particular, in case of isolating an SOI area, a method of the invention comprises:

a step of depositing a layer for a mask on the main surface of an SOI layer set on an insulating substrate, a step of making an opening in the layer for a mask to expose a specified part of the main surface of the SOI layer, a step of forming an isolation trench reaching to the insulating substrate by etching the SOI layer through the opening by making the layer for a mask as a mask.

a step of forming an insulating film on the surface of inside walls of the isolation trench, a step of filling in the isolation trench with a filler through the opening, a step of removing an extra part of the filler deposited on the surface of the layer for a mask to expose the layer for a mask, and a step of removing the mask layer.

Since the mask layer for forming a groove is removed after the groove is filled with a filler and an extra part of the filler protruded out onto the surface of the substrate from the groove is removed, a method of the invention in case of isolating by insulating an SOI area can prevent etching of an insulating film to isolate between the substrates which is exposed inside the isolation trench in the course of the above-mentioned treatment and can prevent local deterioration of dielectric strength in the isolation trench.

To attain the second object of the invention, a method of the invention forms a layer as an etch deterring film in advance under a layer used as a mask in case of forming a groove, and removes the layer for a mask in a state where the etch deterring layer contacts with a filler filled in the groove.

Namely, a method of the invention deposits one by one in order a first layer (layer of an etch deterring film) and a second layer (layer used as a mask in forming a groove), makes an opening for exposing a specified part of the main surface of the semiconductor substrate on the first and second layers, makes a groove by etching the semiconductor substrate through the opening by making the second layer as a mask, forms an insulating film on the surface of inside walls of the trench, fills in the groove with a filler through the opening until the top of the filler comes to be equal to or higher than the first layer in height, and removes the second layer by making the filler and the first layer as an etching stopper.

In particular, in case of performing isolation of an SOI area a method of the invention comprises:

a step of depositing one by one in order a first layer and a second layer on the main surface of an SOI layer set on an insulating substrate, a step of making an opening in the first and second layers to expose a specified part of the main surface of the SOI layer, a step of forming an isolation trench reaching to the insulating substrate by etching the SOI layer through the opening by making the second layer as a mask, a step of forming an insulating film on the surface of inside walls of the isolation trench, a step of filling in the isolation trench with a filler through the opening until the top of the filler comes to be equal to or higher in height than the first layer, and a step of removing the second layer by making the filler and the first layer as an etching stopper.

In this manner, a semiconductor device manufacturing method of the invention forms the first and second layers one by one in order on the main surface of a substrate and controls the top of the filler to be filled in a groove so as to come to be equal to or higher than the first layer in height. Therefore, when etching off the second layer used as a mask in forming the groove, the filler and the first layer prevent proceeding of etching to a layer lower than them, so that, for example, a difference in level in a trench area caused by etching of a field oxide film and the like formed on the surface of a semiconductor substrate and the like does not appear.

According to the invention, therefore, even if an isolation trench is formed in an area where a field oxide film is thick, flatness of the surface of a substrate is not deteriorated and unnecessary magnification in size of a semiconductor device up to now caused by expecting some divergence in mask matching can also be prevented.

And when removing the second layer used as a mask, not only a field oxide film but also an insulating film formed on the surface of inside walls of the groove are not etched in the direction of depth. If the insulating film on the surface of the inside walls of the groove is etched, a sharp difference in level is formed on the surface of the substrate in an area of the trench and causes a problem of breaking or short-circuiting of a polysilicon wiring or aluminum wiring on the surface of the substrate, but if the invention is applied, since a difference in level does not appear on the trench area and the surface of the substrate can be flat, it is made possible to manufacture a semiconductor device having no breaking or short-circuiting of a polysilicon wiring or aluminum wiring.

DESCRIPTION OF PREFERRED EMBODIMENTS

Embodiments of the invention will be described in the following with reference to the drawings.

THE FIRST EMBODIMENT

Figure 1:
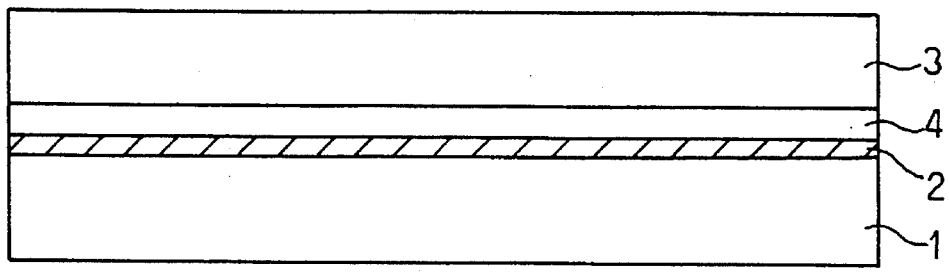
FIG. 1 to 13 are cross-sectional views of an SOI substrate for explaining in order manufacturing process of the SOI substrate in case of applying a manufacturing method of a first embodiment of the invention.

The first embodiment of the invention applies a final polishing to one main surface of a first P⁻type single crystal silicon substrate 1 and then forms an insulating film 2 of specified thickness on it by thermal oxidation. And the embodiment bonds a second single crystal silicon substrate 3 having the finally-polished main surfaces performed mirror-like polishing to the insulating film 2 side of the surface of the first silicon substrate 1 under a sufficiently clean atmosphere and heats them to bond them as one so as to hold the insulating film 2 between the respective silicon substrates 1 and 3. In this manner, an SOI substrate is made which is composed by bonding the second substrate 3 through the insulating film 2 on the first silicon substrate 1 (see FIG. 1). In FIG. 1, a reference number 4 shows and N type high-density impurity (Sb) layer made by doping from the surface of the second N⁻type silicon substrate 3 before performing the bonding.

Figure 2:
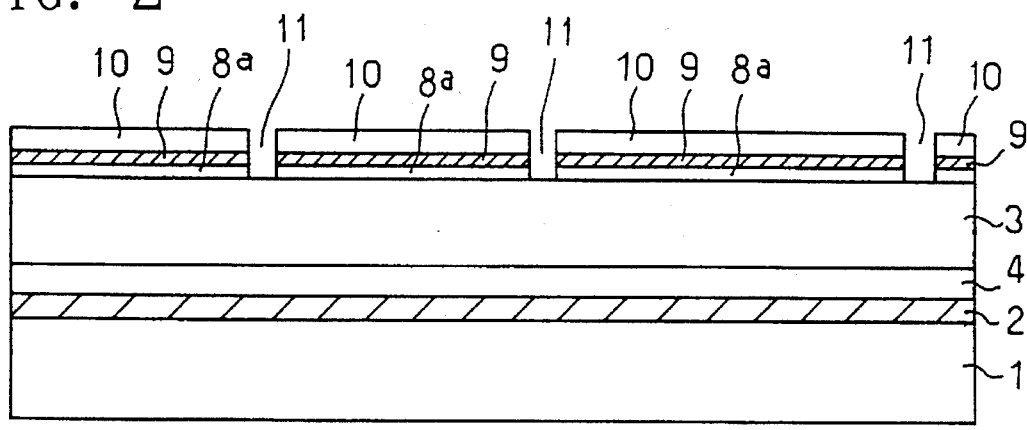

And the embodiment forms a pad oxide film 8a on the surface of the second silicon substrate 3 side by thermal oxidation, deposits one by one in order on this surface an $Si_3N_4$ film 9 as a first insulating layer and an $SiO_2$ film 10 as a second insulating film by a CVD method, and anneals the substrate at 1000° C. to make the $SiO_2$ film 10 closely, and then deposits an unshown photoresist on it, processes it by means of a publicly known photolithography process and R.I.E process using a gas of $CF_4$ or $CHF_3$ series as an etching gas, and makes an opening 11 by selectively etching the $SiO_2$ film 10, $Si_3N_4$ film 9 and pad oxide film 8a up to reaching to the surface of the silicon substrate 3 using the photoresist deposited on the surface of the $SiO_2$ film 10 as a mask (see FIG. 2). FIG. 2 shows a state after stripping off the photoresist.

Figure 3:
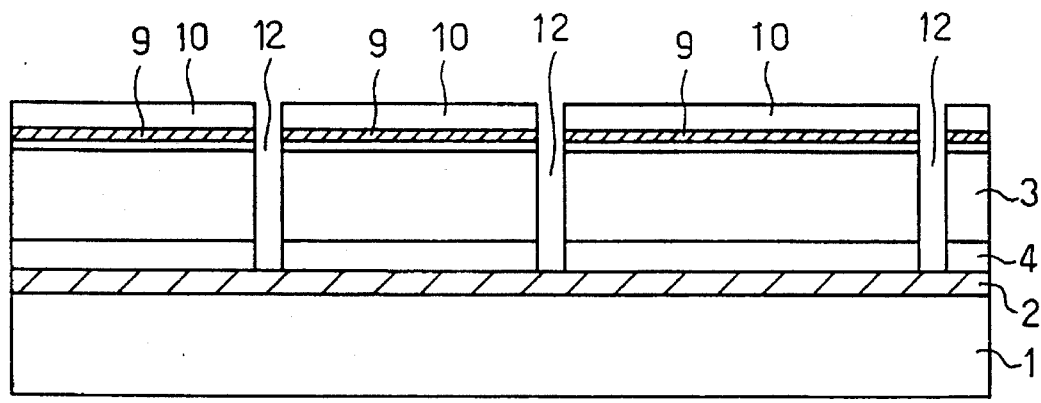

Next, the embodiment makes an isolation trench 12 reaching up to the insulating film 2 by selectively etching the second silicon substrate 3 using the $SiO_2$ film as a mask by means of an R.I.E process using a gas of HBr series as an etching gas (see FIG. 3). In this case, the thickness of the $SiO_2$ film 10 to be deposited has been determined in the previous step so that the isolation trench 12 may successfully reach to the insulating film 2 according by the etching rates of the $SiO_2$ film and the silicon substrate 3.

Next, a C.D.E treatment is applied to the surface of the inside walls of the isolation trench 12. The C.D.E treatment is performed using an RF discharge type plasma etching system under a condition, for example, of material gases of $CF_4$, $O_2$ and $N_2$, a discharge frequency of 13.56 MHz, an etching rate of 1500 Å/min, and a distance from plasma to the wafer of 100 cm. In this manner, the inside wall of the isolation trench 12 is etched by about 1500 Å.

Next, the inside walls of the isolation trench 12 processed in the C.D.E treatment are annealed. The annealing process is performed, for example, by heating for 30 minutes at 1000° C. in an atmosphere of $N_2$.

Next, a sacrifice oxidation process may be applied to the annealed inside walls of the isolation trench 12, the sacrifice oxidation process is performed, for example, by forming a sacrifice oxide film of 500 Å by means of a dry oxidation process at 1000° C. and then removing this sacrifice oxide film by fluoric acid.

And an insulating film 13 is formed on the inside walls of the isolation trench 12 by means of a wet thermal oxidation at 1050° C., for example, and then polysilicon 14 is deposited on it by means of an LP-CVD method. At this time, the polysilicon not only fills the isolation trench 12 but also deposits on the $SiO_2$ film 10 (see FIG. 4).

Figure 5:
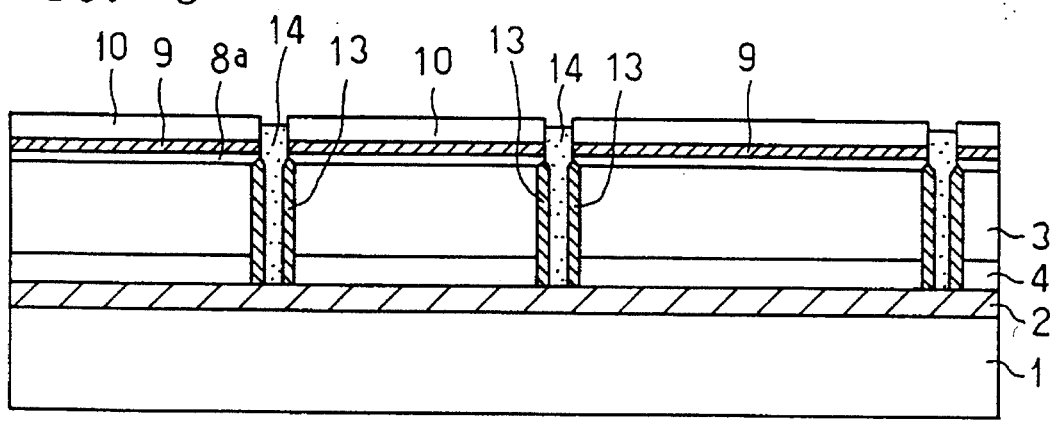

Next, an extra part of the polysilicon 14 deposited on the $SiO_2$ film 10 is subjected to etching back (the first time) by means of a dry etching method (see FIG. 5). At this time, the etching process is stopped so that the top of the polysilicon 14 remaining in the isolation trench 12 is higher than the $Si_3N_4$ film 9.

Figure 6:
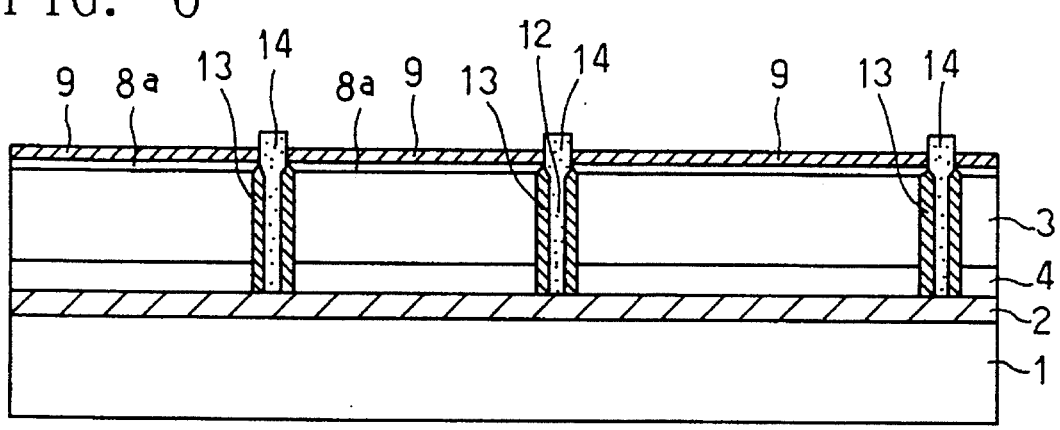

Next, the $SiO_2$ film 10 is etched off by means of a wet etching method using a fluorine solution (see FIG. 6). In this case, since the $Si_3N_4$ film 9 and the polysilicon 14 left so that its top is higher than the $Si_3N_4$ film 9 act as an etching stopper, the pad oxide film 8a and the insulating film 13 formed on the inside walls of the isolation trench 12 are not etched.

Figure 7:
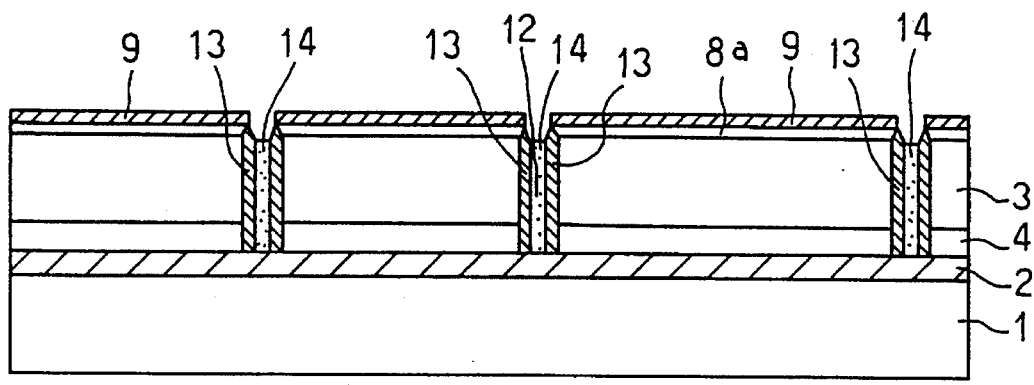

Next, the part of the polysilicon 14 filled in the isolation trench 12 projecting beyond the $Si_3N_4$ film 9 is etched back by dry etching (the second time) (see FIG. 7). In this case, it is desirable to control the top of the polysilicon 14 to come to be about 0.3 µm lower than the top of the pad oxide film 8a so that a thermal oxide film 15 may come to be on a same level with the surrounding pad oxide film 8a when having had the thermal oxide film 15 grow on the polysilicon 14 in the next step as will be described.

Figure 8:
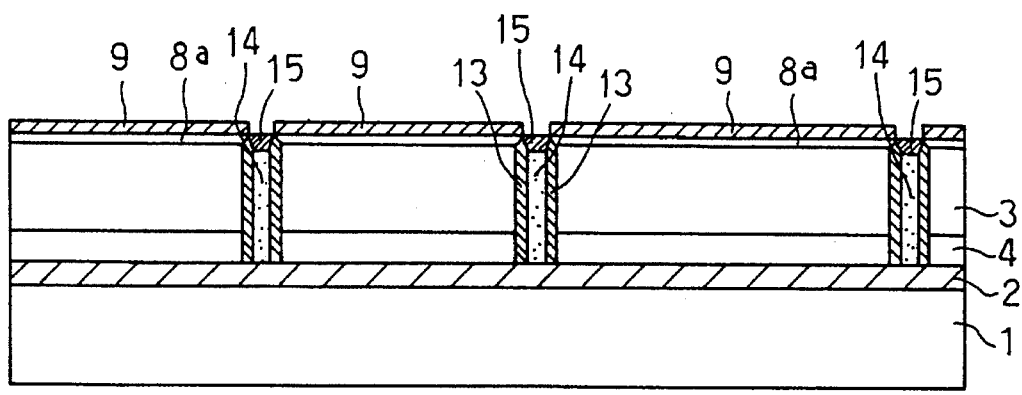
Figure 9:
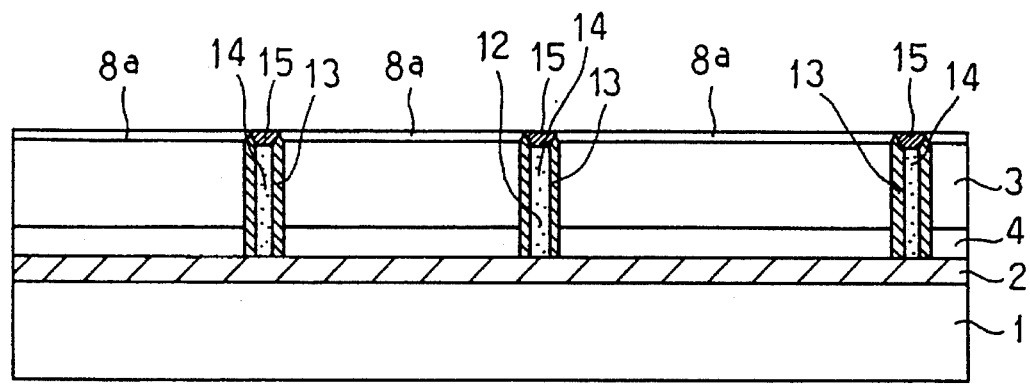

Next, after the oxide film 15 has been grown by selectively thermally oxidizing the top of the polysilicon 14 filled in the isolation trench 12 through an opening of the $Si_3N_4$ film 9 (see FIG. 8), the $Si_3N_4$ film 9 is etched off (see FIG. 9). As is clearly shown in FIG. 9, an area of the isolation trench 12 is kept flat without forming a difference in level.

Figure 10:
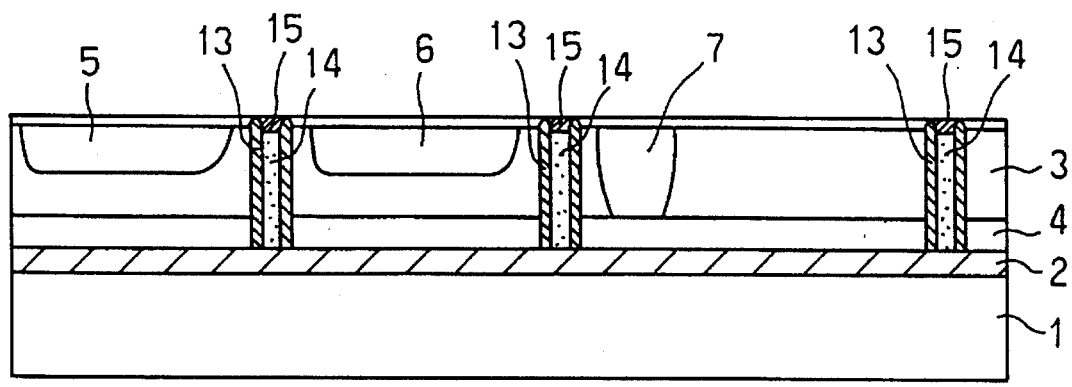

A P well region 5, an N well region 6a and deep $N^+$ region 7 are formed in the second silicon substrate 3 side made into an SOI layer by means of a publicly known photolithography process and impurity diffusion process (see FIG. 10).

Figure 11:
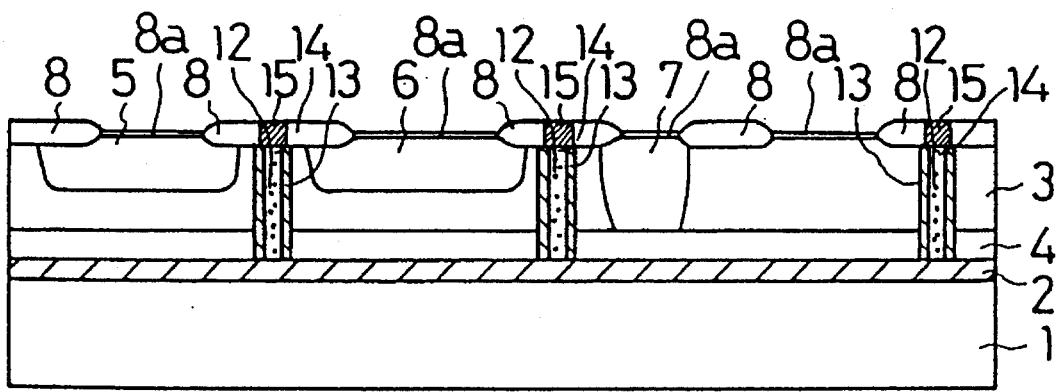

After this, a field oxide film 8 is formed on the surface of the second silicon substrate 3 side by means of LOCOS (local oxidation of silicon) method (see FIG. 11). The LOCOS method is a process which forms again an $Si_3N_4$ film as an oxidation deterring film on a specified part of a substrate and then forms a thick field oxide film 8 by oxidizing a part where the $Si_3N_4$ film is not formed by means of thermal oxidation or the like. FIG. 11 shows a state after removing the $Si_3N_4$ film by $H_3PO_4$ after performing oxidization by means of the LOCOS method.

Figure 12:
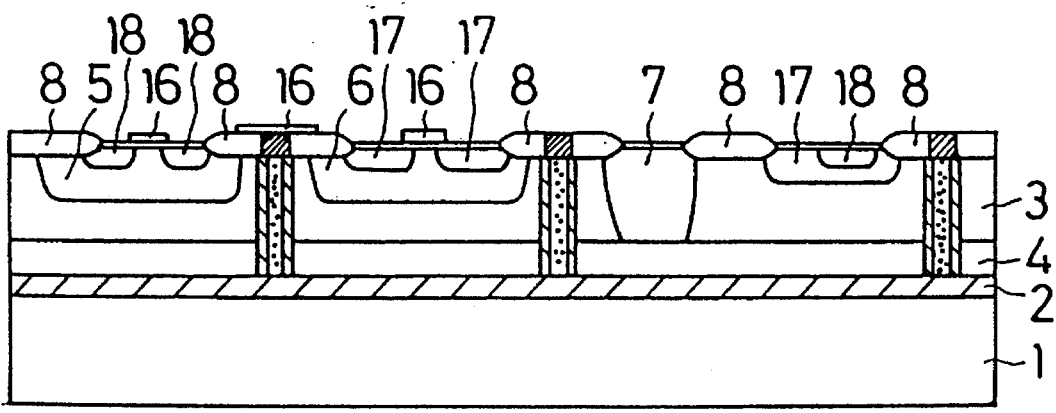

Next, the process of the embodiment forms a thin gate film after removing a pad oxide film 8a, forms a polysilicon wiring (gate electrode) 16 by applying an LP-CVD method, a photolithography process and an etching method, and forms a P+ diffusion layer 17 and an N+ diffusion layer 18 by means of selective doping (see FIG. 12). During this process, since an etched depth of the field oxide film 8 is about 0.2 μm, a flatness of the isolation trench 12 area is not deteriorated.

Figure 13:
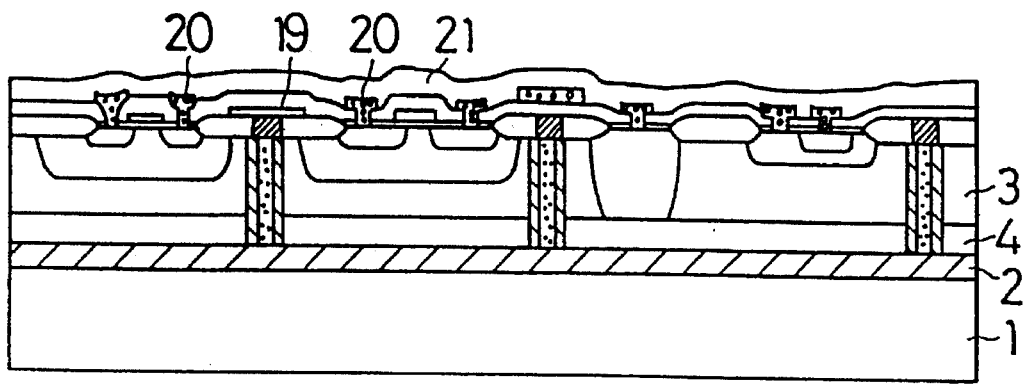

After this, the process deposits an interlayer insulating film 19 of PSG, BPSG or the like, makes a contact hole in a necessary part, and forms an aluminum wiring 20 and a passivation film 21 made of a nitride film or the like by means of plasma CVD method, and thus manufactures a Bi-CMOS semiconductor device in which a CMOS transistor and a bipolar transistor are composited (see FIG. 13).

In this manner, a manufacturing method of the invention prevents proceeding of etching to the pad oxide film 8a or an insulating film 13 and the like which exist under the $Si_3N_4$ film 9 and the polysilicon 14 when etching off the $SiO_2$ film 10 in the parts of isolation trench 12 area. Therefore, since flatness of the isolation trench 12 area can be obtained without making difference in level, such a problem as breaking or short-circuiting of a polysilicon wiring 16 or aluminum wiring 20 is not caused.

And since the embodiment performs C.D.E treatment and annealing process after forming an isolation trench, it can prevent crystal defects which have been inevitably generated on the inside walls of the isolation trench and its surrounding surface of the silicon substrate when forming the isolation trench. This will be described in detail in the following.

Figure 18:
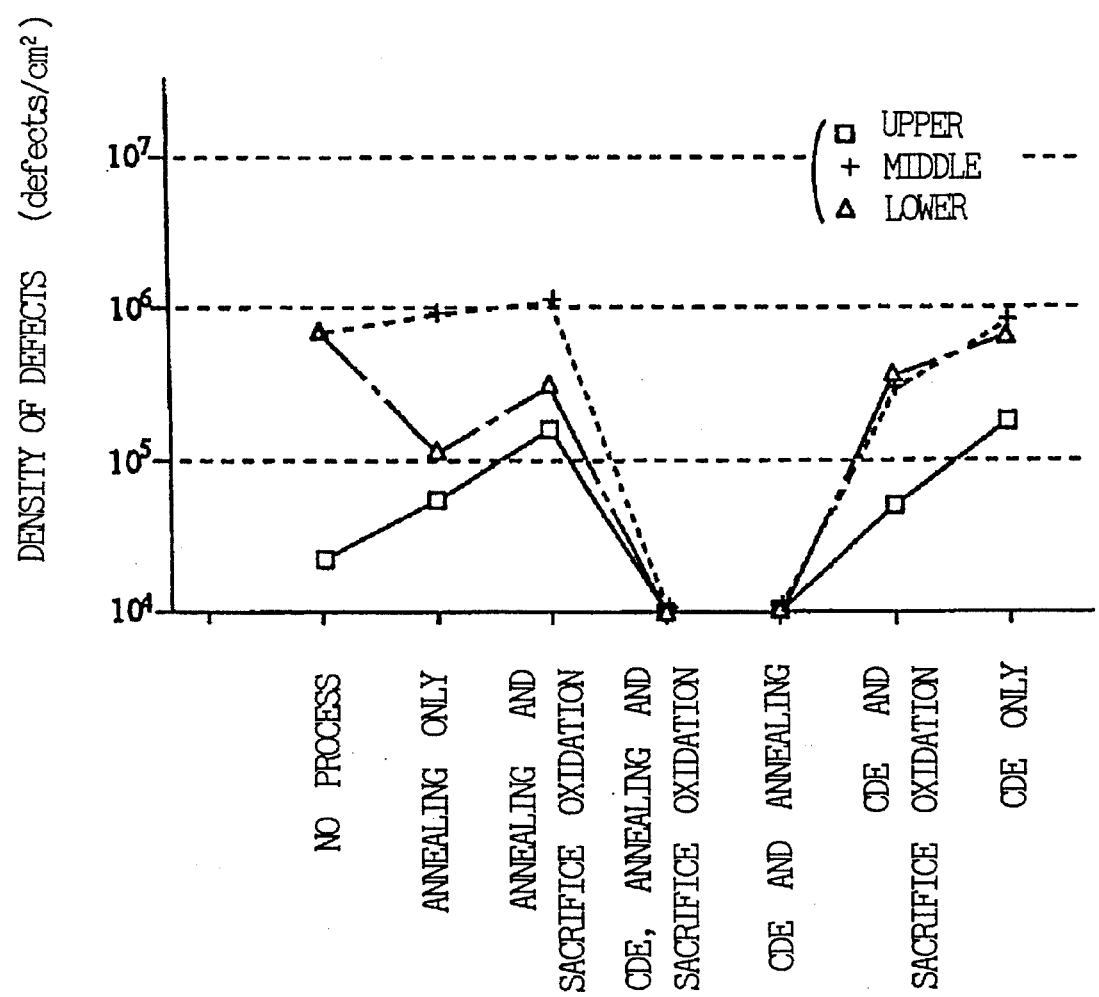
FIG. 18 is a diagram for showing a result of measuring density of defects after forming an isolation trench.

In the above-mentioned embodiment, after an insulating film 13 was formed on the inside walls of the isolation trench 12, the insulating film 13, $SiO_2$ film 8a and $Si_3N_4$ film 9 were etched off, crystal defects were revealed by means of a secco etching process, and the surface of the second silicon substrate 3 was observed by means of an optical microscope. And density of defects was computed by counting defects observed within a square of which one side is 200 μm. The result is shown in FIG. 18.

For comparison, density of defects was examined in the same manner also for ones which were processed neither C.D.E treatment nor annealing process, only an annealing process, an annealing process and a sacrifice oxidation process, only a C.D.E treatment, a C.D.E treatment and a sacrifice oxidation process, and a C.D.E treatment and an annealing process. The result is also shown in FIG. 18. In FIG. 18, a curve plotted by points+shows a result of observing the middle part of the surface of the second silicon substrate 3, a curve plotted by □shows a result of observing the upper part of the surface of the second silicon substrate 3, and a curve plotted by Δ shows a result of observing the lower part of the surface of the second silicon substrate 3.

As the result, in the substrates which were processed by means of neither C.D.E treatment nor annealing process and by means of only one of them, reduction in density of defects was not seen, but crystal defects were observed in the vicinity of the isolation trench 12 on the surface of the second silicon substrate 3. Namely, it has been proved that a former method performing only a sacrifice oxidation process and a C.D.E treatment cannot completely prevent crystal defects and cannot fully solve the troubles caused by crystal defects. On the other hand, crystal defects could be prevented in both substrates which were processed respectively by means of a C.D.E treatment and an annealing process and by means of a C.D.E treatment, an annealing process and a sacrifice oxidation process. As the result, it can be confirmed that it is possible to prevent crystal defects by applying at least a C.D.E treatment and an annealing process. FIG. 18 shows that the density of defects of them is $10_4$ defects/cm$^2$, but this value is brought from the measurement limit and actually any crystal defects have not been observed. The above-mentioned measurement of density of defects was made by observing only the surface of the second silicon substrate 3, but as a result of observing a cross section of the second silicon substrate 3, a method of the embodiment could prevent crystal defects in the inside walls of the isolation trench also.

In this way, damaged layers generated on an inside wall of a groove and on the surface of a silicon substrate in the vicinity of the groove when forming the groove are fully removed by process C.D.E treatment to the inside wall of the groove in the silicon substrate. And a damaged layer which has not completely been removed by the C.D.E process and another damaged layer newly generated by the C.D.E treatment are recovered by annealing the inside wall of the groove. In this manner, it is possible to eliminate crystal defects which have been inevitably generated on an inside wall of a groove and on the surface of a silicon substrate in the vicinity of the groove when forming the trench and to prevent the troubles of current leakage caused by crystal defects.

A condition of the C.D.E treatment is not particularly limited, but it is desirable to be a condition for making it possible to completely etch off a damaged layer generated when forming a groove, and furthermore which can suppress to the utmost a new damaged layer from being generated by the C.D.E process. This C.D.E treatment etches off the substrate to a depth of twice to 5 times of the damaged layer generated when forming the groove.

And a condition of the annealing is not particularly limited so long as it can recover a damaged layer which has not completely removed by a C.D.E treatment and another damaged layer newly generated by a C.D.E process, but it can be done, for example, in a condition of heating for 10 to 30 minutes at 1000° to 1100° C. in an atmosphere of inactive $N_2$.

In the above-mentioned first embodiment, a first etching-back treatment of the polysilicon 14 is performed by a dry etching process, but it may be performed by polishing.

THE SECOND EMBODIMENT

A second embodiment using a polysilicon film 9' instead of an $Si_3N_4$ film 9 in the above-mentioned first embodiment is described in the following.

Figure 14:
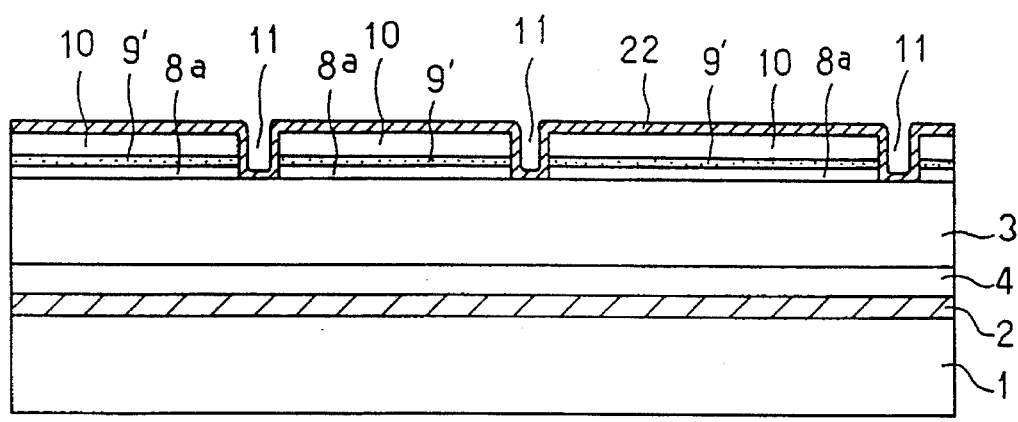
FIGS. 14 to 17 are cross-sectional views of an SOI substrate for explaining in order manufacturing processes of the SOI substrate in case of applying a manufacturing method of a second embodiment of the invention.
Figure 15:
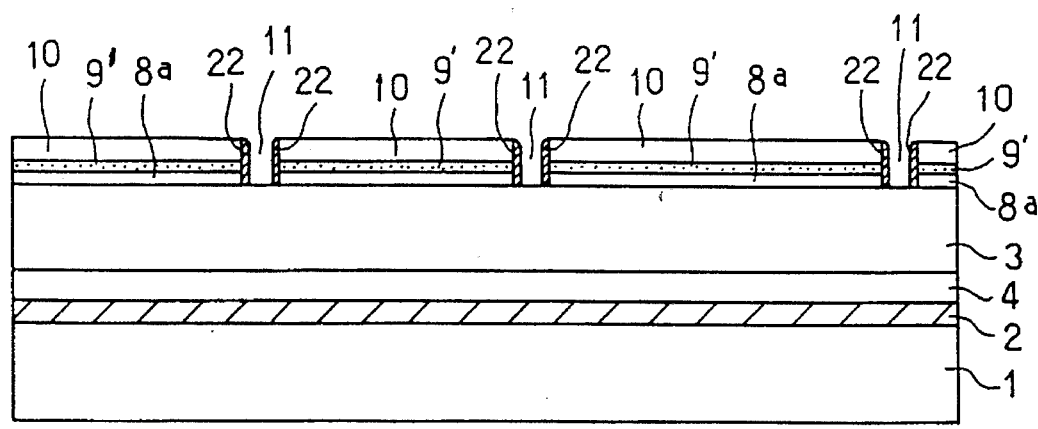

The present embodiment gets an SOI substrate shown in FIG. 1 as mentioned above, forms a pad oxide film 8a on the substrate as described above, deposits in order a polysilicon film 9' by means of LP-CVD method and an $SiO_2$ film 10 by means of a CVD method, and anneals the substrate at 1000° C. to make the $SiO_2$ film 10 closely in the same manner as shown in FIG. 2. After this, the embodiment deposits a photoresist on the substrate, makes a photoresist pattern by means of photolithography treatment, makes an opening 11 in the $SiO_2$ film 10, the polysilicon film 9' and the pad oxide film 8a by means of R.I.E treatment using a gas of $CF_4$ or $CHF_3$ series as an etching gas, and deposits a $Si_3N_4$ film 22 on the surface of the substrate (see FIG. 14). The substrate is then processed by means of an anisotropic R.I.E treatment which leaves the $Si_3N_4$ film 22 only on the side wall of the opening 11 (see FIG. 15). The $Si_3N_4$ film 22 prevents the polysilicon film 9' exposed inside the opening 11 from being oxidized at the same time as when an insulating film 13 is formed on an inside wall of the isolation trench 12 by means of thermal oxidation in the following step.

Figure 16:
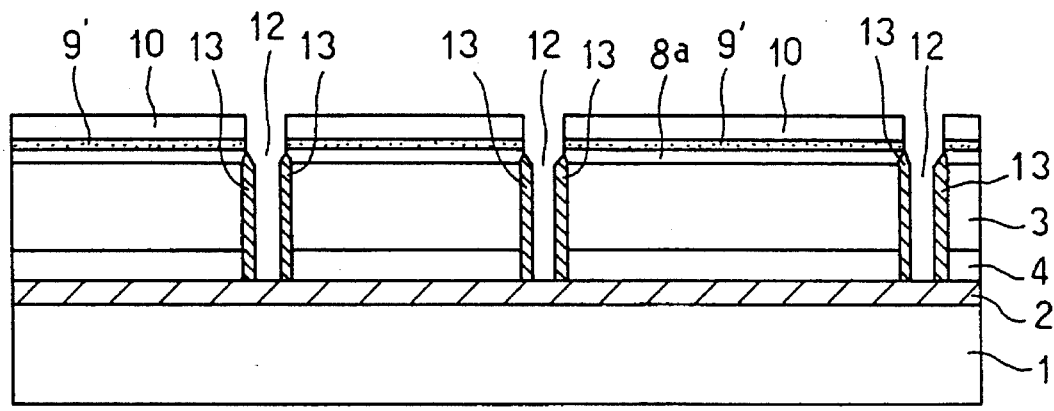

Next, the embodiment selectively etches the second silicon substrate 3 using the SiO$_2$ film as a mask by means of an R.I.E process using a gas of HBr series as an etching gas to make an isolation trench 12 reaching up to the insulating film 2, and processes the inside walls of the isolation trench 12 by means of a C.D.E treatment and an annealing process in order, as described above. And an insulating film 13 is formed by thermally oxidizing the inside walls of the isolation trench 12 and then the Si$_3$N$_4$ film 22 covering the wall of the opening 11 is removed by a H$_3$PO$_4$ solution (see FIG. 16). As described above, in case of forming the insulating film 13, the polysilicon film 9' is not oxidized, since it is covered by the Si$_3$N$_4$ film 22 in the opening 11. If the polysilicon film 9' is oxidized at this time, the oxidized part of the polysilicon film 9' also comes to be etched by etchant at the same time as when etching off the SiO$_2$ film 10 in the following step, and this causes a difference in level in the isolation trench 12 area.

Figure 4:
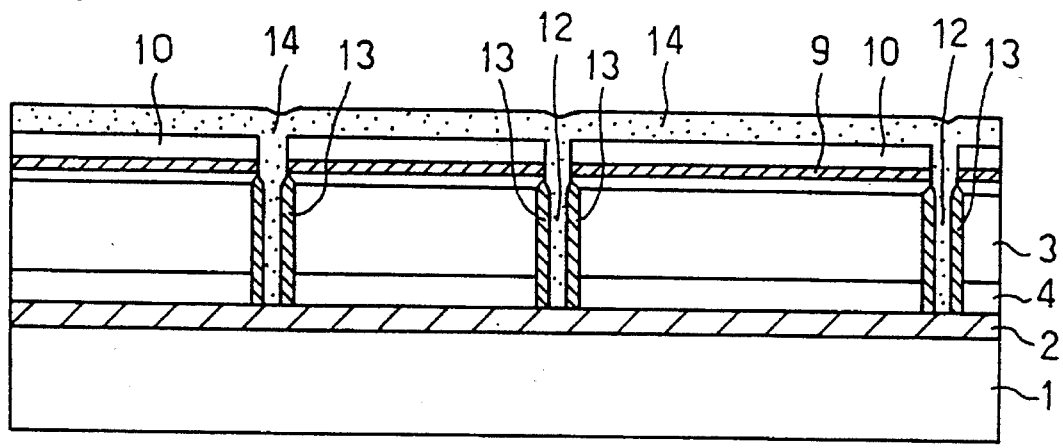
Figure 17:
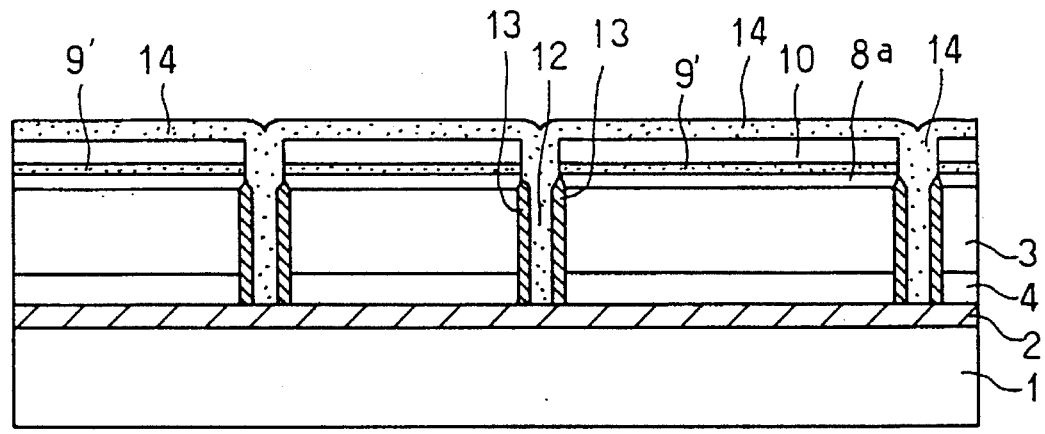

Next, in the same manner as the step shown in FIG. 4, after depositing the polysilicon 14 (see FIG. 17), by passing through the same steps as shown in FIGS. 5 to 13, a Bi-CMOS semiconductor device is manufactured.

In the present embodiment, since the polysilicon film 9' and the polysilicon 14 filled in the isolation trench 12 act as an etching stopper when removing the SiO$_2$ film 10, it is prevented that the pad oxide film 8a under the polysilicon film 9' and the insulating film 13 are etched at the same time. And as described above, since there is not an oxidized part also in the polysilicon film 9', etching does not proceed to a lower layer thereunder.

Furthermore, the second embodiment can remove the polysilicon film 9' at the same time as when applying the second etching-back process to the polysilicon film 14.

THE THIRD EMBODIMENT

The above-mentioned first embodiment forms a pad silicon oxide film of uniform thickness, forms an isolation trench after deposition of an Si$_3$N$_4$ film and an SiO$_2$ film by means of a CVD method, performs in order forming an insulating film on the inside wall of the isolation trench, filling the isolation trench with polysilicon, etching back an extra part of the polysilicon, and etching off the SiO$_2$ film using the Si$_3$N$_4$ film and the polysilicon as an etching stopper, performs patterning of the Si$_3$N$_4$ film or redepositing of the Si$_3$N$_4$ film, and then forms a field oxide film by processing the pad silicon oxide film by means of an LOCOS process, but the field oxide film 8 may be formed by means of an LOCOS process in advance. An example of it is shown in the third embodiment.

Figure 19:
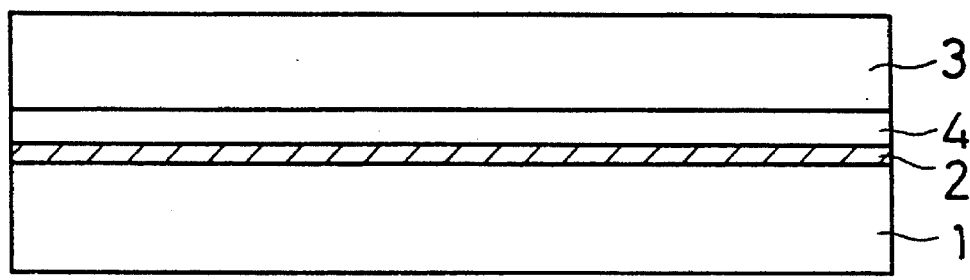
FIGS. 19 to 31 are cross-sectional views of an SOI substrate for explaining in order manufacturing processes of the SOI substrate in case of applying a manufacturing method of a third embodiment of the invention.

The third embodiment of the invention applies a mirror-like polishing to one main surface of a first P$^-$ type single crystal silicon substrate 1 and then forms an insulating film 2 of specified thickness on it by means of thermal oxidation. And the third embodiment bonds a second single crystal silicon substrate 3 having a mirror-like polished main surfaces to the insulating film 2 side of the surface of the first silicon substrate 1 and heats them as a sufficiently clean atmosphere to bond them in one so as to hold the insulating film 2 between the respective silicon substrates 1 and 3. In this manner, an SOI substrate is made which is composed by bonding the second silicon substrate 3 through the insulating film 2 to the first silicon substrate 1 (see FIG. 19). In FIG. 19, a reference number 4 shows an N type high-density impurity (Sb) layer made by doping from the surface of the second N$^-$ type silicon substrate 3 before bonding of the two substrates.

Figure 20:
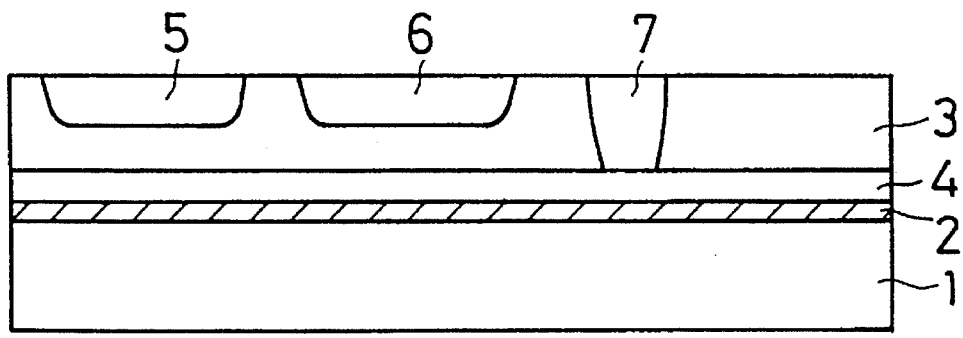

And the embodiment forms a P well region 5, N well region 6 and deep N$^+$ region 7 on the second silicon substrate 3 side made into an SOI layer by means of a series of oxidation, photolithography and impurity diffusion process (see FIG. 20). During this process, an oxide film on the surface of the second silicon substrate 3 can be freely grown and removed.

Figure 21:
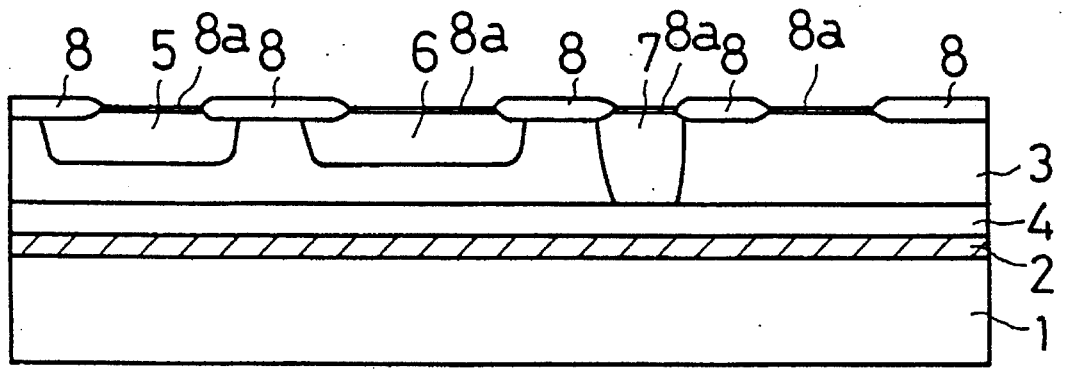

After this, a field oxide film 8 is formed on the surface of the second silicon substrate 3 side by means of a LOCOS method (see FIG. 21). FIG. 21 shows a state after removing an Si$_3$N$_4$ film with H$_3$PO$_4$ after performing oxidation by means of an LOCOS process.

Figure 22:
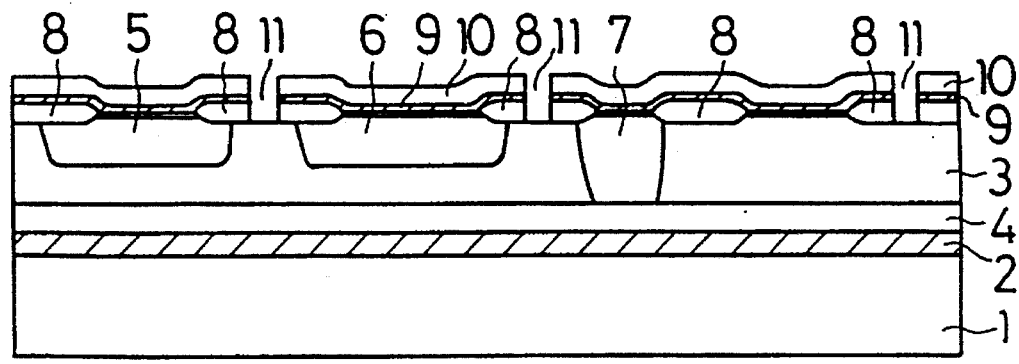

And the third embodiment deposits again in order an Si$_3$N$_4$ film 9 as a first insulating layer and an SiO$_2$ film 10 as a second insulating layer on the surface of the substrate by means of a CVD process, and anneals them at 1000° C. to make the SiO$_2$ film 10 closely. Next, the embodiment deposits an unshown photoresist and in an area where the field oxide film 8 is thick in thickness the embodiment makes an opening 11 reaching to the surface of the silicon substrate 3 by selectively etching the SiO$_2$ film 10, Si$_3$N$_4$ film 9 and field oxide film 8 using the photoresist as a mask by means of a publicly known photolithography process and R.I.E process using a gas of CF$_4$ or CHF$_3$ series as an etching gas (see FIG. 22). FIG. 22 shows a state after stripping off the photoresist.

Figure 23:
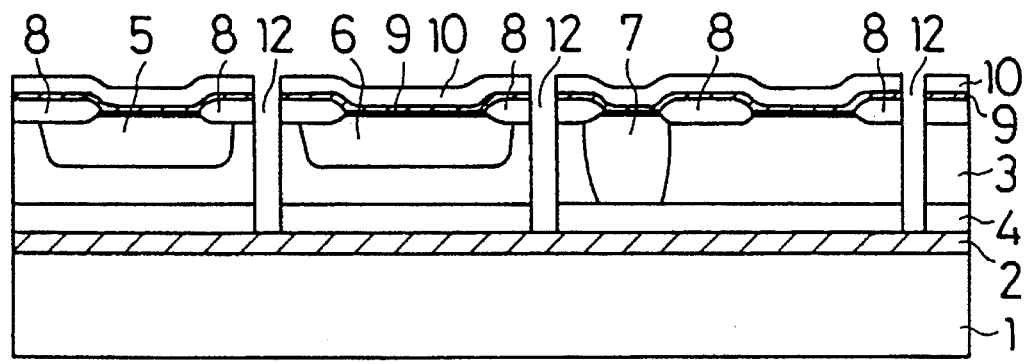

Next, the embodiment makes an isolation trench 12 reaching to the insulating film 2 by selectively etching the second silicon substrate 3 using the SiO$_2$ film 10 as a mask by means of an RIE process using a gas of HBr series as an etching gas film 2 (see FIG. 23). In this case, the thickness of the SiO$_2$ film 10 to be deposited in the previous step has been determined so that the isolation trench 12 may successfully reach to the insulating film 2 by the etching rates of the SiO$_2$ film 10 and the silicon substrate 3.

Next, a C.D.E treatment is applied to the surface of the inside walls of the isolation trench 12. This C.D.E treatment is performed by means of an RF discharge type plasma etching apparatus under a condition, for example, of material gases of CF$_4$, O$_2$ and N$_2$, a discharge frequency of 13.56 MHz, an etching rate of 1500 Å/min, and a distance from the plasma to the wafer of 100 cm. In this manner, the inside walls of the isolation trench 12 are etched by about 1500 Å.

Next, the inside walls of the isolation trench 12 in the C.D.E treatment are annealed. This annealing process is performed, for example, by heating for 30 minutes at 1000° C. in an atmosphere of N$_2$.

Next, a sacrifice oxidation process may be applied to the annealed inside walls of the isolation trench 12. In this sacrifice oxidation process, for example, after forming a sacrifice oxide film of 500 Å by means of a dry oxidation process at 1000° C., then this sacrifice oxide film is removed by fluoric acid.

And an insulating film 13 is formed on the inside walls of the isolation trench 12 by means of a wet thermal oxidation at 1050° C., for example, and then polysilicon 14 is deposited on it by means of an LP-CVD method. At this time, the polysilicon 14 not only fills the isolation trench 12 but also deposits on the SiO$_2$ film 10 (see FIG. 24).

Figure 25:
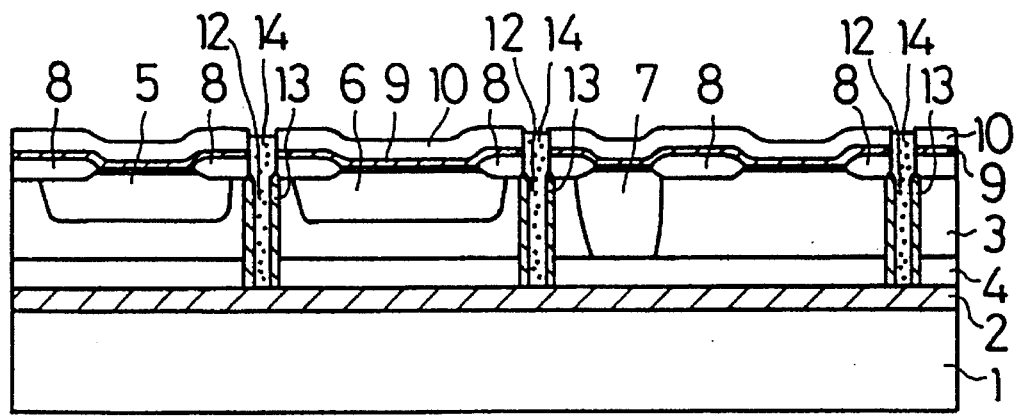

Next, the polysilicon 14 deposited on the SiO$_2$ film 10 by dry etching process is etched back (the first time) (see FIG. 25). At this time, the etching process is stopped so that the top of the polysilicon 14 remaining in the isolation trench 12 is higher than the Si$_3$N$_4$ film 9.

Figure 26:
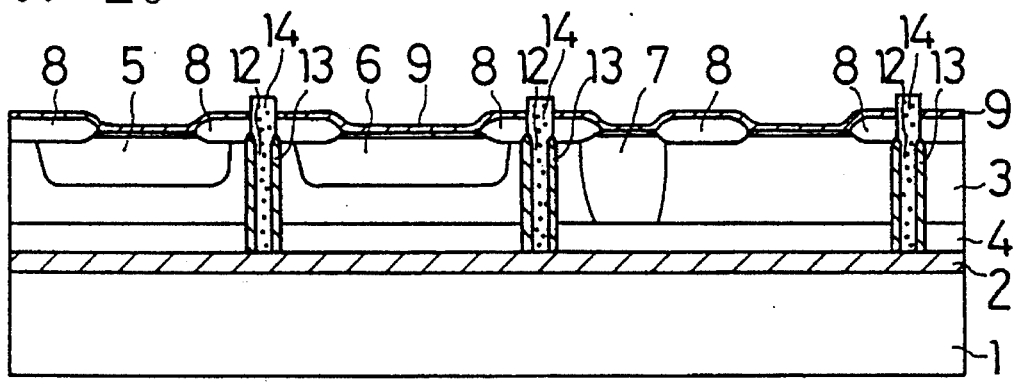

Next, the SiO$_2$ film 10 is etched off by means of a wet etching process using a fluorine solution (see FIG. 26). In this case, since the Si$_3$N$_4$ film 9 and the polysilicon 14 left so that its top portion is higher than the Si$_3$N$_4$ film 9 acts as an etching stopper, the field oxide film 8 under the Si$_3$N$_4$ film 9 and the insulating film 13 formed on the inside walls of the isolation trench 12 are not etched.

Figure 27:
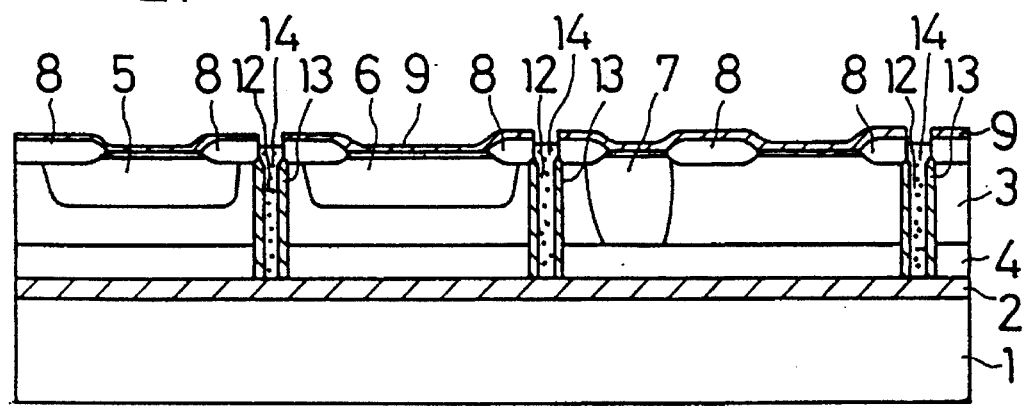

Next, the part of the polysilicon 14 filled in the isolation trench 12 which projects beyond the Si$_3$N$_4$ film 9 is etched back (the second time) (see FIG. 27). In this case, it is desirable to control the top of the polysilicon 14 to come to be 0.3 μm lower than the top of the field oxide film 8 so that a thermal oxide film 15 may come to be on a same level with the surrounding field oxide film 8 when growing the thermal oxide film 15 which will be described later on the polysilicon 14 in the next step.

Figure 28:
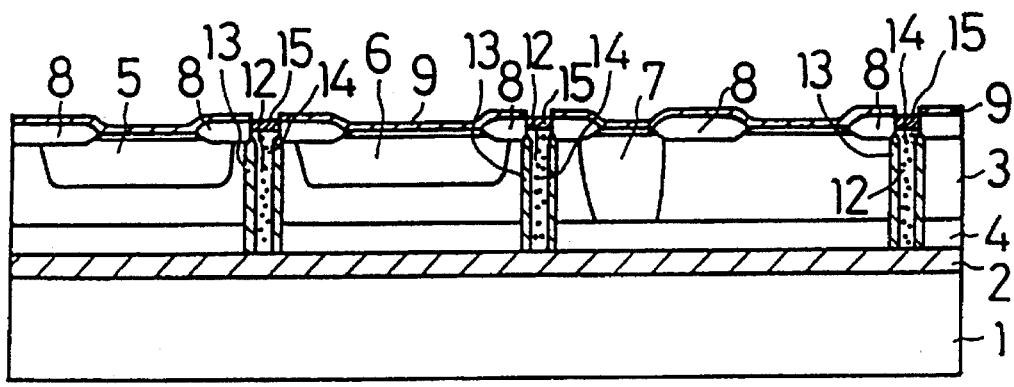
Figure 29:
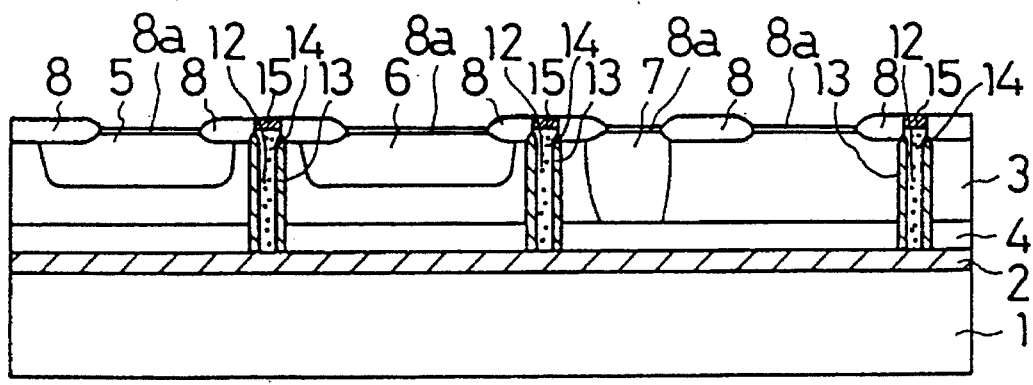

Next, after the oxide film 15 has been grown by thermally oxidizing the top of the polysilicon 14 filled in the isolation trench 12 by the Si$_3$N$_4$ film 9 (see FIG. 28), the Si$_3$N$_4$ film 9 is etched off (see FIG. 29). As is clearly shown in FIG. 29, an area of the isolation trench 12 is kept flat without making a difference in level.

Figure 30:
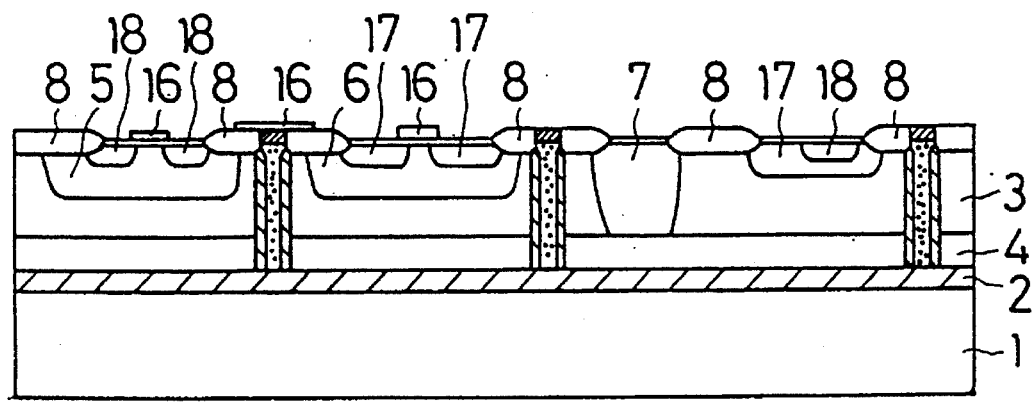

And the third embodiment forms a thin gate oxide film after removing a pad oxide film 8a, then forms a polysilicon wiring (gate electrode) 16 by means of an LP-CVD method, photolithography process and etching process, and forms a P$^+$ diffusion layer 17 and N$^+$ diffusion layer 18 by means of selective doping (see FIG. 30). During this process, since an etching depth of the field oxide film 8 is about 0.2 μm, a flatness of the isolation trench 12 area is not deteriorated.

Figure 31:
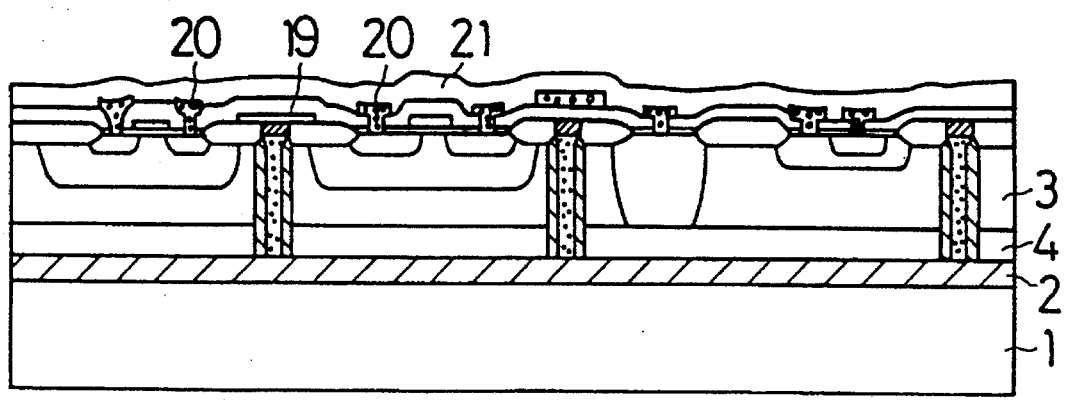

After this, the present embodiment deposits an interlayer insulating film 19 of PSG, BPSG or the like, makes a contact hole in a necessary part, and forms an aluminum wiring 20 and a passivation film 21 made of a nitride film or the like by means of a plasma CVD method, and thus manufactures a Bi-CMOS semiconductor device in which a CMOS transistor and a bipolar transistor are composited (see FIG. 31).

In this manner, a manufacturing method of the invention prevents the proceeding of etching for an oxide film such as a field oxide film 8 or an insulating film 13 and the like which exist under the Si$_3$N$_4$ film 9 and the polysilicon 14 when etching off the SiO$_2$ film 10 in the isolation trench 12 area. Therefore, since flatness of the isolation trench 12 area can be obtained without making difference in level, such troubles as breaking or short-circuiting of a polysilicon wiring 16 or aluminum wiring 20 is not caused.

Figure 37:
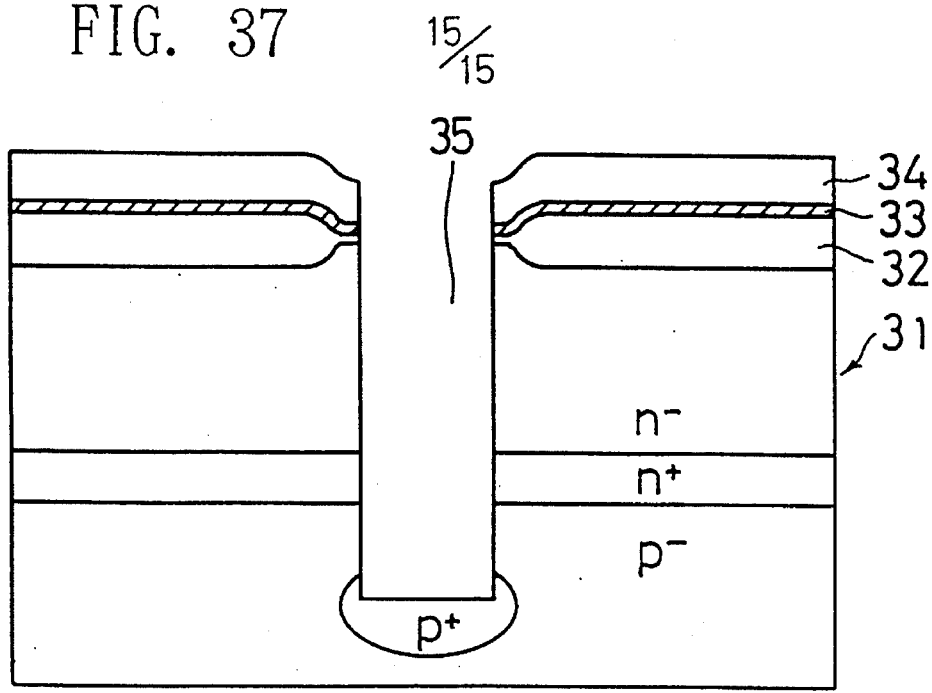
FIGS. 37 an 38 are cross-sectional views of a substrate for explaining a former treatment of forming a trench.
Figure 38:
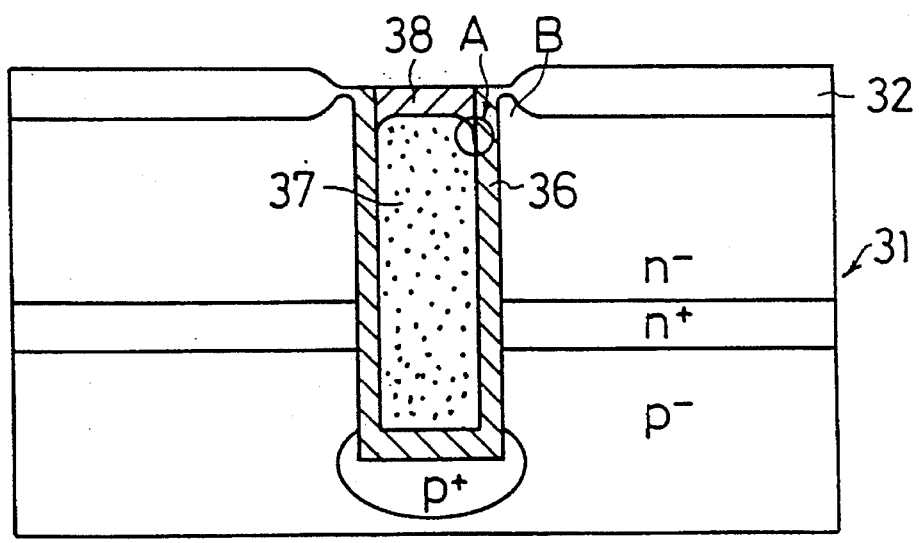

And in the above-mentioned former method shown in FIGS. 37 and 38, since an isolation trench 35 is formed in an area where an field oxide film 32 is thin in thickness, a edge part B of the silicon substrate 31 exists around the top of the isolation trench 35, so the etched-back top of the polysilicon 37 comes to be lower than the edge part B. Therefore, a vertical bird's beak A comes to be formed in a corner when forming an oxide film 38 on the top of the polysilicon 37 and as a result a problem has been brought that crystal defects are liable to be generated by stress concentration to the edge part B of the silicon substrate 31.

In the present embodiment, since an isolation trench is formed in an area where a field oxide film 8 is thick in thickness and the top of the polysilicon 14 which has performed the second etching-back process comes to be higher than the top of the second silicon substrate 3 (see FIG. 27), crystal defects are not generated when oxidizing the polysilicon 14 without stress concentration to the second silicon substrate 3 caused by a vertical bird's beak as formed in a former method which forms an isolation trench in an area where a field oxide film 8 is thin in thickness (see FIGS. 37 and 38). Therefore, leakage of current caused by crystal defects can be prevented. Furthermore, in opposition to the former method which forms an isolation trench in an area where a field oxide film 8 is thin in thickness, the present embodiment does not need to make a semiconductor larger in size for the allowance for some divergence in mask matching, so it can make the semiconductor device smaller in size.

In this manner, the embodiment makes it possible to form an isolation trench in an area where a field oxide film is thick in thickness without deteriorating flatness of a silicon substrate. Therefore, since it is not necessary to allow for some divergence in mask matching and occurrence of crystal defects of a silicon substrate is also deterred, a semiconductor device can be manufactured which does not have breaking or short-circuiting of a polysilicon wiring and aluminum wiring and is not made unnecessarily large in size.

And since an isolation trench is formed after forming a field oxide film, it is thought that occurrence of crystal defects around the isolation trench can be deterred. Namely, if a field oxide film is formed after forming an isolation trench, it is feared that the volume expands when forming the field oxide film and crystal defects are generated by stress concentration to the boundary between a silicon substrate and an isolation trench, but the present embodiment does not have such a fear.

Furthermore, the present embodiment also applies a C.D.E treatment and annealing process to an inside wall of the isolation trench 12. Thanks to this, the embodiment makes it possible to fully or completely remove by means of a C.D.E treatment a damaged layer generated on the inside wall of the isolation trench 12 when forming the isolation trench 12, to remove by means of the following annealing process the damaged layer which has not completely been removed by the C.D.E treatment and another damaged layer newly generated by the C.D.E process, and elimination of crystal defects on the inside walls and the like of the isolation trench 12 becomes possible.

In the above-mentioned third embodiment, the first process of etching back the polysilicon 14 is performed by a dry etching process, but it may be done by a polishing process.

THE FOURTH EMBODIMENT

The fourth embodiment using a polysilicon film 9' instead of an Si$_3$N$_4$ film 9 used in the third embodiment is described in the following.

Figure 32:
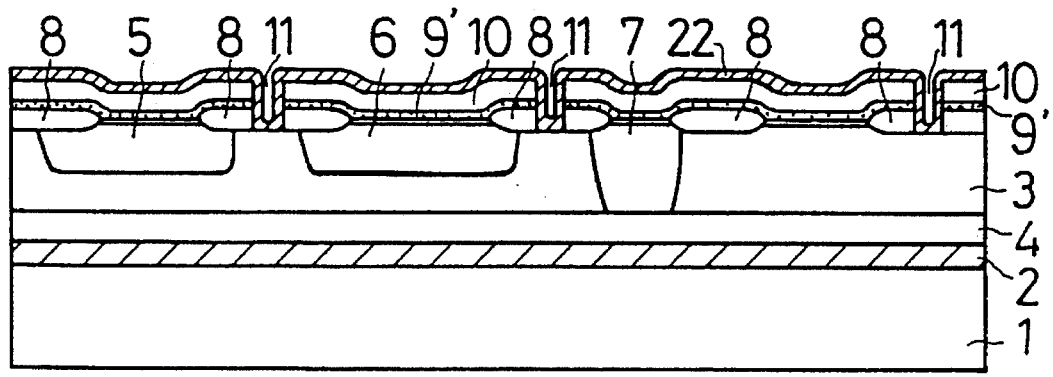
FIGS. 32 to 35 are cross-sectional views of an SOI substrate for explaining in order manufacturing processes of the SOI substrate in case of applying a manufacturing method of a fourth embodiment of the invention.
Figure 33:
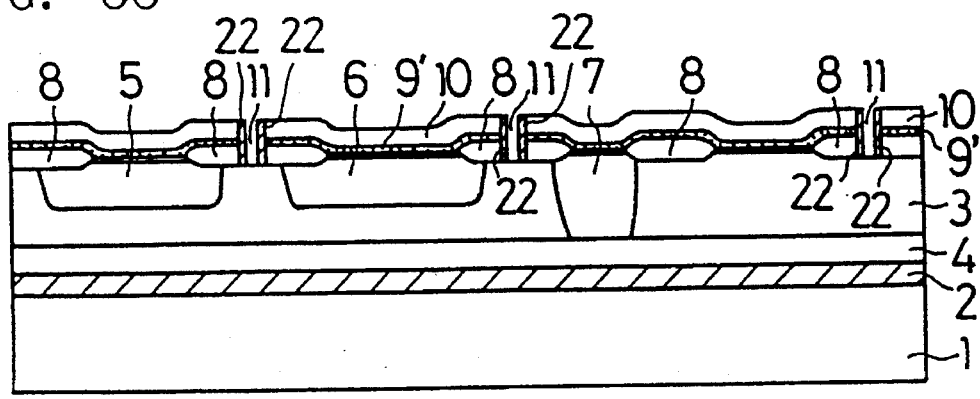

After processing a substrate in the steps shown in FIGS. 19 to 21, the present embodiment deposits in order a polysilicon film 9' by means of an LP-CVD method and an SiO$_2$ film 10 by means of a CVD method and anneals the substrate at 1000° C. in the same way as the process shown in FIG. 22 to make the SiO$_2$ film 10 closely. After this, the present embodiment deposits a photoresist, forms a photoresist pattern by means of a photolithography process, makes an opening 11 in the SiO$_2$ film 10, polysilicon film 9' and field oxide film 8 by means of an R.I.E process using a gas of CF$_4$ or CHF$_3$ based as an etching gas, and deposits an Si$_3$N$_4$ film 22 on the surface of the substrate (see FIG. 32). And the embodiment leaves the Si$_3$N$_4$ film 22 only on a side wall of the opening 11 by means of an anisotropic R.I.E process (see FIG. 33). The Si$_3$N$_4$ film 22 prevents the polysilicon film 9' exposed in the opening 11 from being oxidized at the same time as when forming an insulating film 13 on an inside wall of the isolation trench 12 by thermal oxidation in the following step.

Figure 34:
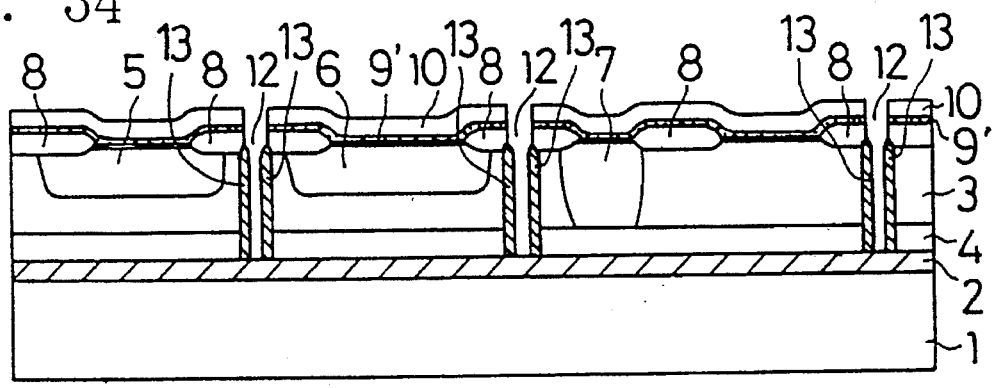

Next, the embodiment selectively etches the second silicon substrate 3 using the $SiO_2$ film 10 as a mask by means of an R.I.E process using a gas of HBr series as an etching gas to form the isolation trench 12 reaching to the insulating film 2, applies in order a C.D.E treatment and an annealing process on the inside wall of the isolation trench 12 as described above, and forms the insulating film 13 by means of thermal oxidation, and then removes the $Si_3N_4$ film 22 covering the surface of the wall of the opening 11 by means of $H_3PO_4$ solution (see FIG. 34). As described above, in case of forming the insulating film 13, the polysilicon film 9' is not oxidized, since it is covered by the $Si_3N_4$ film 22 in the opening 11. If the polysilicon film 9' is oxidized at this time, the oxidized part of the polysilicon film 9' also comes to be etched by an etchant at the same time as when etching off the $SiO_2$ film 10 in the following step, and this causes a difference in level in the isolation trench area.

Figure 24:
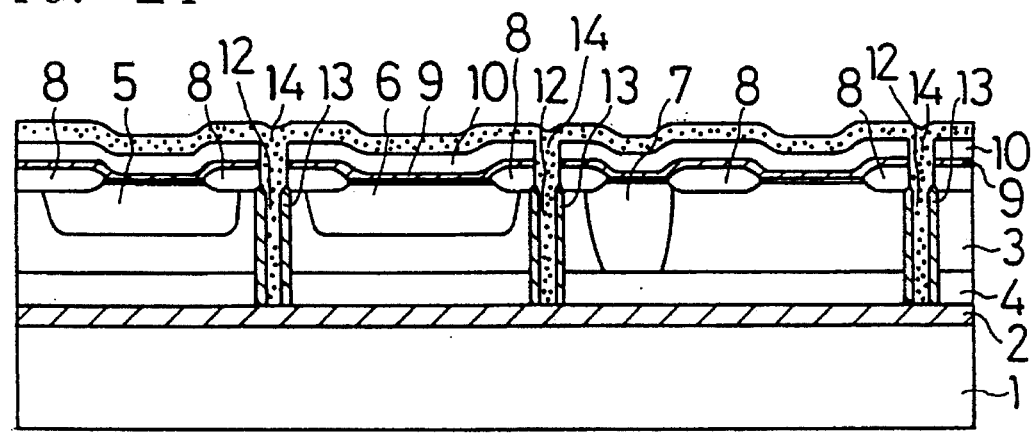
Figure 35:
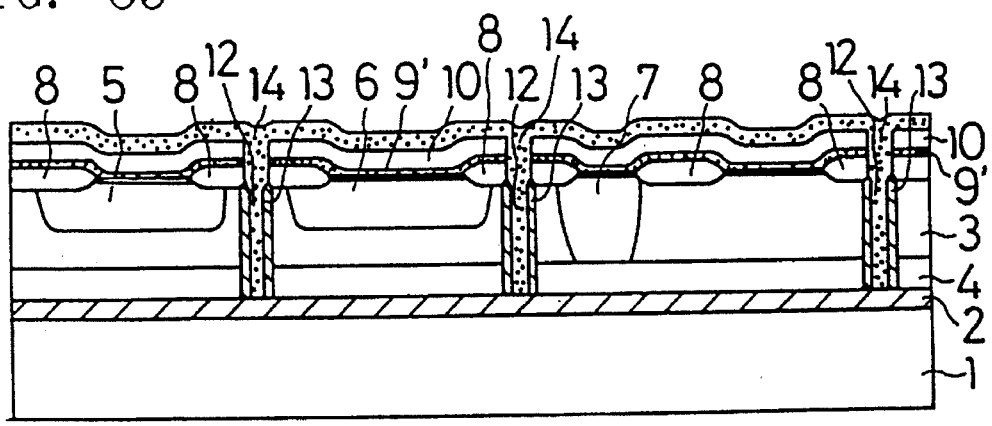
Figure 36A:
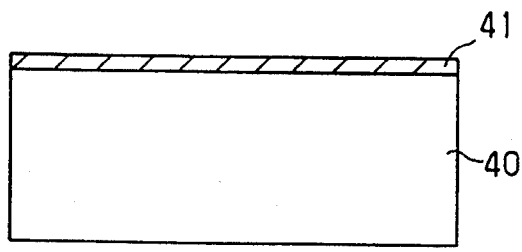
FIGS. 36(A) to 36(E) are cross-sectional views of an SOI substrate for explaining in order former manufacturing processes of the SOI substrate.
Figure 36D:
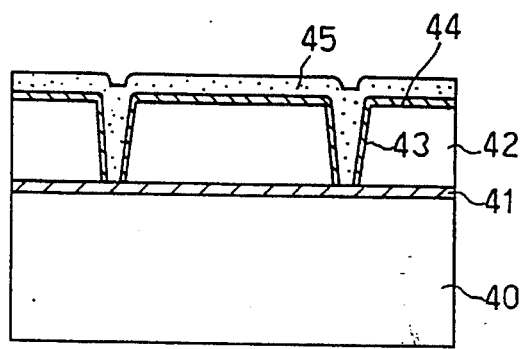
Figure 36B:
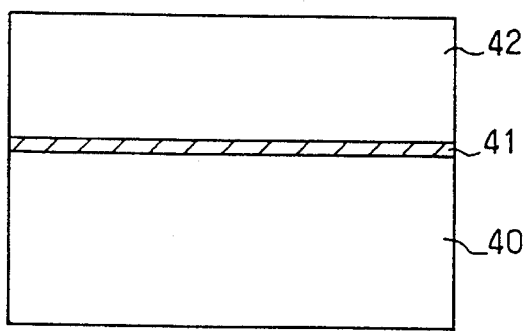
Figure 36E:
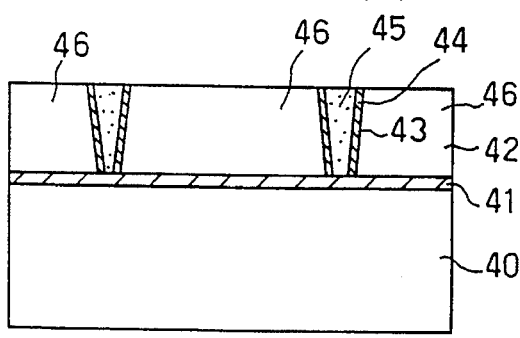
Figure 36C:
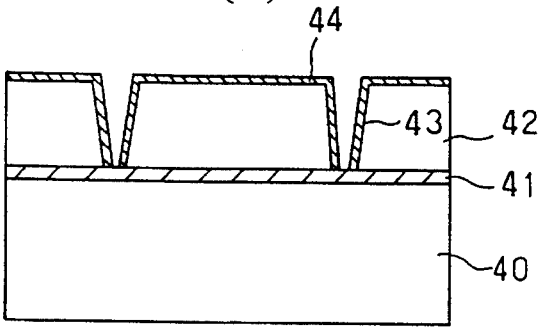

Next, in the same manner as the step shown in FIG. 24, after depositing the polysilicon 14 (see FIG. 35), by passing through the same steps as shown in FIGS. 25 to 31, a Bi-CMOS semiconductor device shown in FIG. 31 is manufactured.

In the present embodiment, since the polysilicon film 9' and the polysilicon 14 filled in the isolation trench 12 act as an etching stopper when etching off the $SiO_2$ film, it is prevented that the field oxide film 8 and the insulating film 13 under the polysilicon film 9' are etched at the same time. And as described above, since there is not an oxidized part also in the polysilicon film 9', the etching does not proceed to a lower layer from there.

Furthermore, the present fourth embodiment can remove the polysilicon film 9' at the same time as when applying the second etching-back process to the polysilicon film 14.

In the above-mentioned various embodiments, as an oxide film to be used as a mask when forming an isolation trench, an $SiO_2$ film is formed by means of a CVD method, but PSG (phospho silicate glass) film also may be formed instead of the $SiO_2$ film.

And the above-mentioned various embodiments show examples of applying the invention to an isolation trench of an SOI substrate, but the invention can be applied also to a trench capacitor and trench isolation of a simple silicon substrate.

INDUSTRIAL APPLICABILITY

According to a manufacturing method of the invention described above, an insulating film in a groove, a field oxide film around the groove, or the like can be prevented from being etched at the same time as when etching off a film used as a mask when forming the groove. Therefore, such disadvantages as local reduction of dielectric strength in a groove area, deterioration of flatness of the surface of a substrate in the groove area, and the like are not brought about and a semiconductor substrate having a trench with high reliable in a wiring layer can be supplied, and the invention is very effective, for example, in manufacturing an SOI substrate having an isolation trench.

What is claimed is:

1. A method for manufacturing a semiconductor device comprising steps of:

depositing a mask layer on a main surface of a semiconductor substrate;

forming an opening in the mask layer exposing a portion of the main surface of the semiconductor substrate;

forming a groove by etching the semiconductor substrate through the opening in the mask layer;

processing an inside wall of the groove by means of a chemical dry etching process;

annealing the inside wall of the groove processed by the chemical dry etching process;

forming an insulating film on an inside wall of the groove;

filling the groove with a filler through the opening;

exposing the mask layer by removing a portion of the filler deposited on the surface of the mask layer; and removing the mask layer.

2. A method for manufacturing a semiconductor device as defined in claim 1, wherein the annealing process is a process of heating the semiconductor substrate at about 1000° to 1100° C. in an atmosphere of inactive gas.

3. A method for manufacturing a semiconductor device comprising steps of:

depositing a mask layer on a main surface of an SOI layer set on an insulating substrate;

forming an opening in the mask layer exposing a portion of the main surface of the SOI layer;

forming an isolation trench reaching through to the insulating substrate by etching the SOI layer through the opening in the mask layer;

processing an inside wall of the isolation trench by means of a chemical dry etching process;

annealing the inside wall of the isolation trench processed by the chemical dry etching process;

forming an insulating film on an inside wall of the isolation trench;

filling in the isolation trench with a filler through the opening;

exposing the layer for a mask by removing an extra part of the filler deposited on the surface of the mask layer; and removing the mask layer.

4. A method for manufacturing a semiconductor device as defined in claim 3, wherein the annealing process is a process of heating the semiconductor substrate at about 1000° to 1100° C. in an atmosphere of inactive gas.

5. A method for manufacturing a semiconductor device comprising steps of:

depositing in order a first layer and a second layer on a main surface of a semiconductor substrate;

forming an opening in the first layer and the second layer exposing a portion of the main surface of the semiconductor substrate;

forming a groove by etching the semiconductor substrate through the opening using the second layer as a mask;

forming an insulating film on an inside wall of the groove, the insulating film being a material different from a material of the first layer;

filling the groove with a filler through the opening until a top surface of the filler becomes equal to or higher than the first layer in height and so that the filler contacts the first layer at the opening; and removing the second layer using the filler filled to the height equal to or higher than the first layer and the first layer as an etching stopper to prevent the insulating film located below a contact portion between the first layer and the filler from being etched during the removal of the second layer.

6. A method for manufacturing a semiconductor device as defined in claim 5, comprising a further step, after the step of removing the second layer, of selectively removing the first layer.

7. A method for manufacturing a semiconductor device as defined in claim 5, comprising further steps, after the step of forming a groove by etching the semiconductor substrate, of:

processing an inside wall of the groove by means of a chemical dry etching process; and annealing the inside wall of the groove processed by the chemical dry etching process.

8. A method for manufacturing a semiconductor device as defined in claim 5, comprising a step, before the step of forming an insulating film on an inside wall of the groove, of covering an end face of the first layer exposed inside the opening with an oxidation-resisting film.

9. A method for manufacturing a semiconductor device comprising steps of:

depositing in order a first layer and a second layer on a main surface of an SOI layer set on an insulating substrate;

forming an opening in the first layer and the second layer exposing a portion of the main surface of the SOI layer;

forming an isolation trench reaching through to the insulating substrate by etching the SOI layer through the opening using the second layer as a mask;

forming an insulating film on an inside wall of the isolation trench, the insulating film being a material different from a material of the first layer;

filling the isolation trench with a filler through the opening until a top surface of the filler becomes equal to or higher than the first layer in height and so that the filler contacts the first layer at the opening; and removing the second layer using the filler and the first layer as an etching stopper to prevent the insulating film located below a contact portion between the first layer and the filler from being etched during the removal of the second layer.

10. A method for manufacturing a semiconductor device as defined in claim 9, comprising a further step, after the step of removing the second layer, of selectively removing the first layer.

11. A method for manufacturing a semiconductor device as defined in claim 9, comprising further steps, after the step of forming an isolation trench, of:

processing an inside wall of the isolation trench by means of a chemical dry etching process; and annealing the inside wall of the isolation trench processed by the chemical dry etching process.

12. A method for manufacturing a semiconductor device comprising steps of:

depositing in order a first layer and a second layer on a main surface of an SOI layer set on an insulating substrate;

forming an opening in the first layer and the second layer exposing a portion of the main surface of the SOI layer;

forming an isolation trench reaching through to the insulating substrate by etching the SOI layer through the opening using the second layer as a mask;

covering an end face of the first layer exposed inside the opening with an oxidation-resisting film;

forming an insulating film on an inside wall of the isolation trench;

filling the isolation trench with a filler through the opening until a top surface of the filler becomes equal to or higher than the first layer in height; and removing the second layer using the filler and the first layer as an etching stopper.

13. A method for manufacturing a semiconductor device comprising steps of:

forming a field oxide film having a thick portion and a thin portion, a silicon nitride film, and a silicon oxide film to be used as a mask, in order, on a main surface of a silicon substrate;

forming an opening in the thick portion of the field oxide film by selectively etching the thick portion of the field oxide film, the silicon nitride film, and the silicon oxide film;

forming a groove by etching the silicon substrate through the opening using the silicon oxide film as a mask;

forming an insulating film on an inside wall of the groove;

filling the groove with polysilicon;

etching back the polysilicon deposited on the silicon oxide film by controlling the etching so that a top surface of the polysilicon in the groove becomes higher than a top surface of the silicon nitride film; and etching off the silicon oxide film using the polysilicon in the groove and the silicon nitride film as an etching stopper for the field oxide film and the insulating film.

14. A method for manufacturing a semiconductor device comprising:

forming a field oxide film having a thick portion and a thin portion, a polysilicon film, and a silicon oxide film to be used as a mask, in order, on a main surface of a silicon substrate;

forming an opening in the thick portion of the field oxide film by selectively etching the thick portion of the field oxide film, the polysilicon film, and the silicon oxide film;

covering the polysilicon film exposed on a surface of a wall of the opening with an oxidation-resisting film;

forming a groove by etching the silicon substrate from the opening using the silicon oxide film as a mask;

forming an insulating film on an inside wall of the groove;

filling the groove with polysilicon for filling;

etching back the polysilicon for filling deposited on the silicon oxide film while controlling the etching so that a top surface of the polysilicon for filling in the groove becomes higher than a top surface of the polysilicon film; and etching off the silicon oxide film using the polysilicon for filling in the groove and the polysilicon film as an etching stopper for the field oxide film and the insulating film.

15. A method for manufacturing a semiconductor device according to claim 5, wherein the first layer is a silicon nitride film, the second layer is a silicon oxide film, and the insulating film is a silicon oxide film.

16. A method for manufacturing a semiconductor device according to claim 15, wherein the filler is polycrystalline silicon.

17. A method for manufacturing a semiconductor device according to claim 6, wherein the first layer is a silicon nitride film, the second layer is a silicon oxide film, and the insulating film is a silicon oxide film.

18. A method for manufacturing a semiconductor device according to claim 17, wherein the filler is polycrystalline silicon.

19. A method for manufacturing a semiconductor device according to claim 7, wherein the first layer is a silicon nitride film, the second layer is a silicon oxide film, and the insulating film is a silicon oxide film.

20. A method for manufacturing a semiconductor device according to claim 19, wherein the filler is polycrystalline silicon.

21. A method for manufacturing a semiconductor device according to claim 9, wherein the first layer is a silicon nitride film, the second layer is a silicon oxide film, and the insulating film is a silicon oxide film.

22. A method for manufacturing a semiconductor device according to claim 21, wherein the filler is polycrystalline silicon.

23. A method for manufacturing a semiconductor device according to claim 10, wherein the first layer is a silicon nitride film, the second layer is a silicon oxide film, and the insulating film is a silicon oxide film.

24. A method for manufacturing a semiconductor device according to claim 23, wherein the filler is polycrystalline silicon.

25. A method for manufacturing a semiconductor device according to claim 11, wherein the first layer is a silicon nitride film, the second layer is a silicon oxide film, and the insulating film is a silicon oxide film.

26. A method for manufacturing a semiconductor device according to claim 25, wherein the filler is polycrystalline silicon.

* * * * *